(12) United States Patent
Lee

(10) Patent No.: US 10,749,139 B2
(45) Date of Patent: Aug. 18, 2020

(54) DISPLAY DEVICE AND METHOD OF MANUFACTURING THE SAME

(71) Applicant: Samsung Display Co., Ltd., Yongin-si (KR)

(72) Inventor: Seung Hoon Lee, Hwaseong-si (KR)

(73) Assignee: Samsung Display Co., Ltd, Yongin-si (KR)

( * ) Notice: Subject to any disclaimer, the term of this patent is extended or adjusted under 35 U.S.C. 154(b) by 0 days.

(21) Appl. No.: 16/222,947

(22) Filed: Dec. 17, 2018

(65) Prior Publication Data

US 2020/0013987 A1    Jan. 9, 2020

(30) Foreign Application Priority Data

Jul. 5, 2018    (KR) .................. 10-2018-0078139

(51) Int. Cl.
| | | |
|---|---|---|
| *H05K 1/02* | (2006.01) | |
| *H01L 51/52* | (2006.01) | |
| *H01L 51/00* | (2006.01) | |
| *C09J 7/38* | (2018.01) | |
| *G09F 9/30* | (2006.01) | |
| *H01L 51/56* | (2006.01) | |

(52) U.S. Cl.
CPC ........... *H01L 51/5246* (2013.01); *C09J 7/38* (2018.01); *G09F 9/301* (2013.01); *H01L 51/0097* (2013.01); *H01L 51/5253* (2013.01); *H01L 51/56* (2013.01)

(58) Field of Classification Search
CPC .................................................. H05K 1/0206
USPC ....................................................... 174/252
See application file for complete search history.

(56) References Cited

U.S. PATENT DOCUMENTS

| | | | | |
|---|---|---|---|---|
| 8,388,792 | B2 * | 3/2013 | Weidinger | ........... H05K 3/4691 156/247 |
| 10,069,107 | B2 | 9/2018 | Jeon | |
| 10,141,540 | B2 | 11/2018 | Sung et al. | |
| 2010/0112272 | A1 * | 5/2010 | Hirano | ........................ C09J 9/02 428/77 |
| 2013/0335928 | A1 * | 12/2013 | Tseng | ........................ H05K 3/10 361/748 |
| 2019/0040215 | A1 * | 2/2019 | Murata | ........................ C08J 5/18 |
| 2019/0189828 | A1 * | 6/2019 | Huang | ................. G02B 26/101 |

FOREIGN PATENT DOCUMENTS

| | | |
|---|---|---|
| JP | 2010-518648 | 5/2010 |
| KR | 10-2017-0021431 | 2/2017 |
| KR | 10-2017-0140490 | 12/2017 |

* cited by examiner

*Primary Examiner* — Stanley Tso

(74) *Attorney, Agent, or Firm* — H.C. Park & Associates, PLC

(57) ABSTRACT

A method of manufacturing a display device includes preparing a base substrate including a first area, a second area, and a bending area disposed between the first and second areas, the base substrate having a coating film pattern formed on a first surface thereof in the bending area; disposing a support plate, which includes an adhesive film and a support film, on the first surface of the base substrate to cover the coating film pattern; and separating the support plate and the coating film pattern, which overlap with each other in a thickness direction, from the base substrate, wherein the disposing the support plate includes disposing the support plate in such a manner that the adhesive film is in contact with the coating film pattern and the first surface of the base substrate.

9 Claims, 34 Drawing Sheets

DISPLAY DEVICE AND METHOD OF MANUFACTURING THE SAME

CROSS REFERENCE TO RELATED APPLICATION

This application claims priority from and the benefit of Korean Patent Application No. 10-2018-0078139, filed on Jul. 5, 2018, which is hereby incorporated by reference for all purposes as if fully set forth herein.

BACKGROUND

Field

Exemplary embodiments/implementations of the invention relate generally to a display device and a method of manufacturing the same.

Discussion of the Background

Flexible display devices have recently attracted attention as next-generation display devices. Flexible display devices are display devices having a display unit, signal wiring, and the like formed on a flexible substrate made of a flexible material such as plastic, and such flexible displays can display images even when bent like paper.

The range of application of flexible display devices has diversified and widened from computer monitors and televisions (TVs) to personal portable devices, and research has been conducted on flexible display devices having a large display area and a reduced volume and weight.

There are largely two types of flexible display device fabrication methods, i.e., a cell-based display device fabrication method in which each individual display device is fabricated separately and a mother substrate-based display device fabrication method in which multiple display devices are fabricated at the same time using a mother substrate and are then separated from one another. The cell-based display device fabrication method fabricates a single display device at a time and is disadvantageous over the mother substrate-based display device fabrication method in terms of processing time and cost.

The above information disclosed in this Background section is only for understanding of the background of the inventive concepts, and, therefore, it may contain information that does not constitute prior art.

SUMMARY

Exemplary embodiments of the present disclosure provide a display device which can be easily bent and can prevent a display panel from cracking.

Exemplary embodiments of the present disclosure also provide a method of manufacturing a display device which can allow a support film to be easily cut in a bending area and can prevent damage to a base substrate.

Additional features of the inventive concepts will be set forth in the description which follows, and in part will be apparent from the description, or may be learned by practice of the inventive concepts.

According to an exemplary embodiment, there is provided a method of manufacturing a display device that includes: preparing a base substrate including a first area, a second area, and a bending area disposed between the first and second areas, and having a coating film pattern formed on a first surface thereof in the bending area; disposing a support plate, which includes an adhesive film and a support film, on the first surface of the base substrate to cover the coating film pattern; and separating the support plate and the coating film pattern, which overlap with each other in a thickness direction, from the base substrate, wherein disposing the support plate includes disposing the support plate in such a manner that the adhesive film is in contact with the coating film pattern and the first surface of the base substrate.

In an exemplary embodiment, the separating the support plate and the coating film pattern may include scribing the support plate.

In an exemplary embodiment, the scribing the support plate may include scribing the support plate along a first boundary between the first area and the bending area and along a second boundary between the second area and the bending area.

In an exemplary embodiment, the scribing the support plate may further include scribing the support plate along the first and second boundaries at the same time.

In an exemplary embodiment, the scribing the support plate may include separating the support plate into a first support plate in the first area and a second support plate in the second area.

In an exemplary embodiment, the scribing the support plate may include using a laser member or a heat knife.

In an exemplary embodiment, each of the first and second support plates may include a burr-shaped portion near the bending area.

In an exemplary embodiment, the separating the support plate and the coating film pattern may include separating both the scribed support plate in the bending area and the coating film pattern coupled to the adhesive film of the scribed support plate in the bending area.

In an exemplary embodiment, the disposing the support plate may include coupling the adhesive film and the coating film pattern together.

In an exemplary embodiment, a first bonding force between the adhesive film and the coating film pattern may be greater than a second bonding force between the base substrate and the coating film pattern.

In an exemplary embodiment, a third bonding force between the adhesive film and the first surface of the base substrate may be greater than the second bonding force.

In an exemplary embodiment, the first bonding force may be the same in both the disposing the support plate and the separating the support plate and the coating film pattern, and the second bonding force may be the same in both the disposing the support plate and the separating the support plate and the coating film pattern.

In an exemplary embodiment, the coating film pattern may include at least one of olefin, silicone, long-chain alkyl, and fluorine molecules, and the adhesive film may include a pressure sensitive adhesive (PSA).

According to an exemplary embodiment, a display device includes a base substrate including a first area, a second area, and a bending area, which is disposed between the first and second areas; first and second support plates disposed on a first surface of the base substrate and separated from each other with the bending area disposed therebetween; and a first coating film pattern disposed between the first support plate and the first surface of the base substrate, wherein the first support plate is disposed in the first area and includes a first adhesive film disposed on the first surface of the base substrate and a first support film disposed on the first adhesive film, the second support plate is disposed in the second area and includes a second adhesive film disposed on the first surface of the base substrate and a second support film disposed on the second adhesive film, the first coating film pattern includes a first side facing the bending area and a second side opposite to the first side, and a first surface of the first coating film pattern and the second side are covered by the first adhesive film.

In an exemplary embodiment, the first side of the first coating film pattern may be exposed from the first adhesive film.

In an exemplary embodiment, the first side of the coating film pattern may be aligned, in a thickness direction, with one side of the first adhesive film facing the bending area.

In an exemplary embodiment, the first side of the coating film pattern may be aligned with a boundary between the bending area and the first area.

In an exemplary embodiment, the first coating film pattern may include at least one of olefin, silicone, long-chain alkyl, and fluorine molecules, and the first adhesive film may include a pressure sensitive adhesive (PSA).

In an exemplary embodiment, the display device may include a second coating film pattern disposed between the second support plate and the first surface of the base substrate.

In an exemplary embodiment, the first and second coating film patterns may include the same material.

According to the aforementioned and other exemplary embodiments of the inventive concepts, a display device which can be easily bent and can prevent a display panel from cracking can be provided.

In addition, a method of manufacturing a display device which can allow a support film to be easily cut in a bending area and can prevent damage to a base substrate can be provided.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
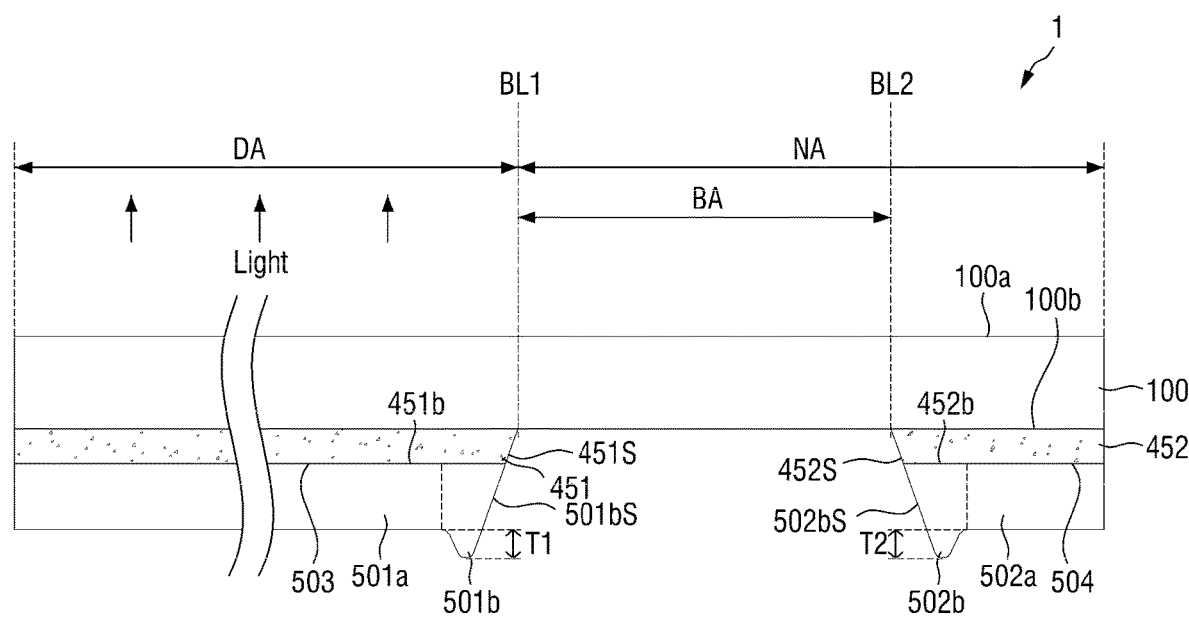
FIG. 1 is a cross-sectional view of a display device according to an exemplary embodiment in an unbent state.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
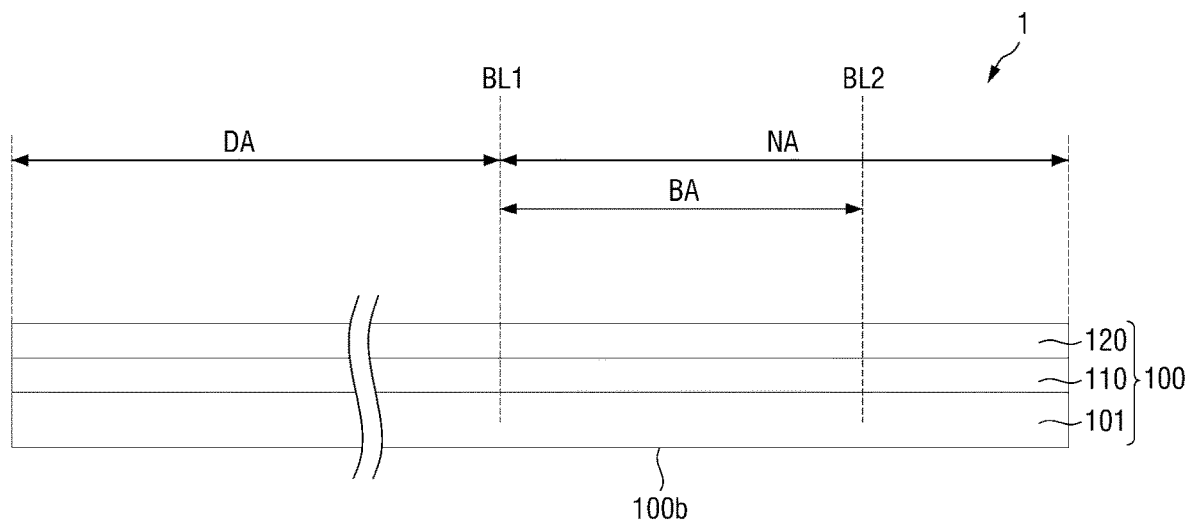
FIG. 2 is a cross-sectional view of a display panel of FIG. 1.
Figure 3:
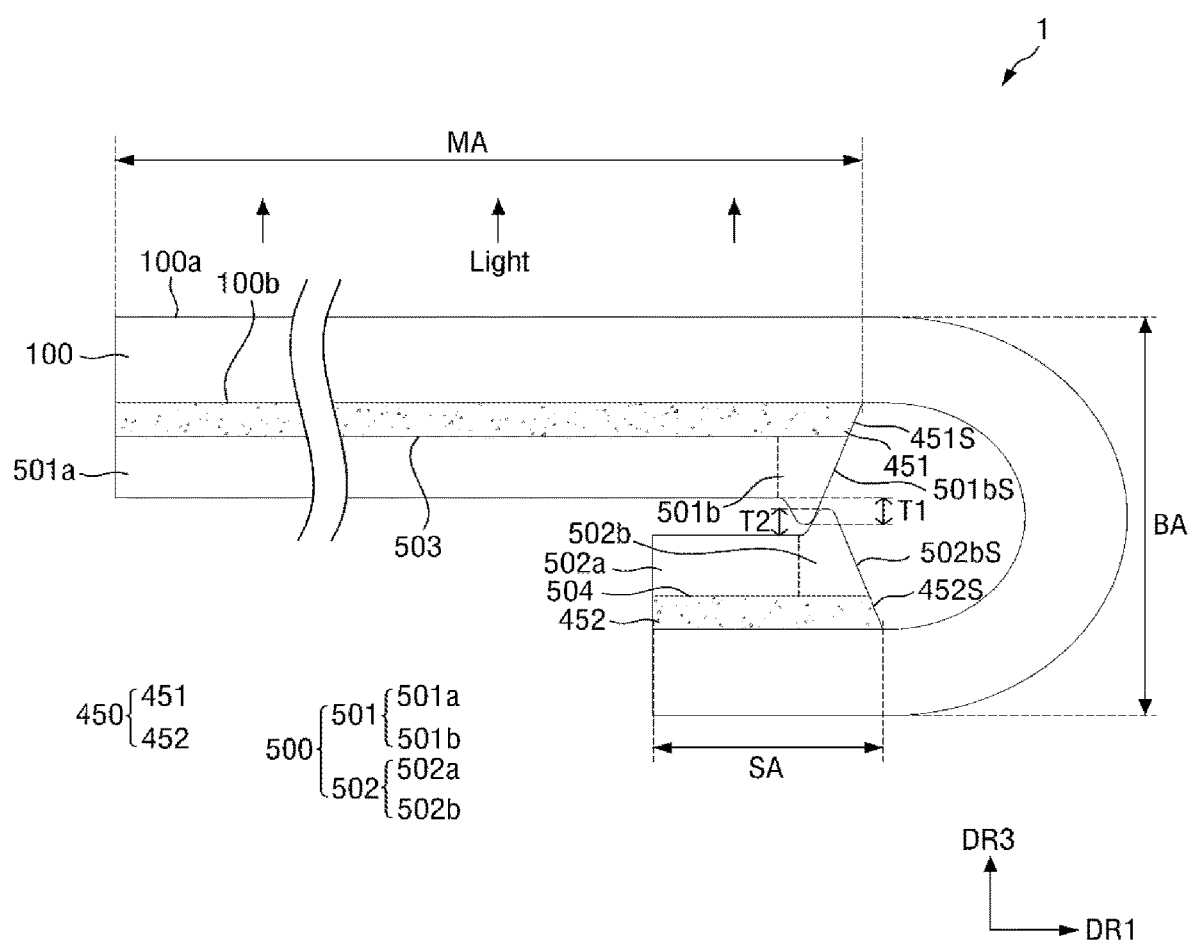
FIG. 3 is a cross-sectional view of the display device of FIG. 1 in a bent state.

FIG. 1 is a cross-sectional view of a display device according to an exemplary embodiment in its unbent state, FIG. 2 is a cross-sectional view of a display panel of FIG. 1, and FIG. 3 is a cross-sectional view of the display device of FIG. 1 in its bent state.

Referring to FIGS. 1, 2, and 3, a display device 1, which is a device for displaying a moving image or a still image, may be used not only in mobile electronic devices such as a mobile phone, a smartphone, a tablet personal computer (PC), a smart watch, a watch phone, a mobile communication terminal, an electronic notepad, an electronic book, a portable multimedia player (PMP), a navigation device, or an ultra-mobile PC (UMPC), but also in various other electronic devices including, but not limited to, a television (TV), a notebook computer, a monitor, a billboard, or an Internet of Things (IoT) device.

For example, the display device 1 may be a flexible display device.

The term "flexible," as used herein, encompasses the characteristics of being foldable, bendable, and rollable. Thus, the term "flexible display device," as used herein, encompasses a foldable display device, a bendable display device, and a rollable display device.

The display device 1 may include a display area DA in which an image is displayed and a non-display area NA which is disposed on the periphery of the display area DA.

The display area DA includes a plurality of pixels and emits light generated by each of the pixels in a display direction. For example, the display direction may be a third direction DR3.

The non-display area NA may be disposed adjacent to the display area DA in a first direction DR1. Driving circuits or signal wiring for applying signals to the display area DA may be disposed in the non-display area NA. The non-display area NA may include a bending area BA.

The bending area BA may be included in the non-display area NA. The bending area BA may be an area defined by a first boundary BL1, which adjoins the display area DA in the first direction DR1, and a second boundary BL2, which is spaced apart from the first boundary BL1 in the first direction DR1. As will be described later with reference to FIG. 2, the bending area BA may be an area that can be bent with a predetermined curvature radius when the display device 1 is bent in one direction. The curvature radius of the display device 1 may be defined as the radius of an almost circular shape formed by the bending area BA when the bending area BA is bent.

First boundary BL1 of the bending area BA is illustrated as coinciding with a boundary of the display area DA and the non-display area NA, but exemplary embodiments are not limited thereto. That is, one boundary, such as first boundary BL1, of the bending area BA may not coincide with the boundary of the display area DA and the non-display area NA, and first boundary BL1 of the bending area BA may be disposed apart from the display region DA along the first direction. In this case, first boundary BL1 may be located in the non-display area NA, but may not overlap with the display area DA.

The display device 1 may include a display panel 100 which is disposed across the display area DA and the non-display area NA. The display panel 100 may include a top surface 100a and a bottom surface 100b. The display device 1 may include adhesive layers 451 and 452 disposed on the bottom surface 100b of the display panel 100 and support films 501 and 502 disposed on bottom surfaces 451b and 452b, respectively, of the adhesive layers 451 and 452. Although not specifically illustrated, a touch panel including a plurality of touch electrodes and a window covering the display panel 100 from outside the display panel 100 may be further disposed on the top surface 100a of the display panel 100.

The display panel 100 may be, for example, an organic light-emitting diode (OLED) display panel. In the description that follows, it is assumed that an OLED display panel is used as the display panel 100, but exemplary embodiments are not limited thereto. That is, various other display panels such as a liquid crystal display (LCD) panel, a quantum dot light-emitting diode (QLED) display panel, a micro-LED, a field emission display (FED) panel, or an electrophoretic display (EPD) may be used as the display panel 100.

As illustrated in FIG. 2, the display panel 100 may include a base substrate 101, a driving layer 110, and an OLED layer 120.

The base substrate 101 may be disposed across the display area DA and the non-display area NA. The base substrate 101 provides the bottom surface 100b of the display panel 100. The base substrate 101 may be a flexible substrate and may include a thermosetting resin. For example, the base substrate 101 may include polyethylene ether phthalate, polyethylene naphthalate, polycarbonate, polyarylate, polyetherimide, polyether sulfone, or polyimide. In a case where the base substrate 101 includes a thermosetting resin, the base substrate 101 may have a predetermined burning point $T_b$. The burning point $T_b$ may vary depending on the material of the base substrate 101, but may generally be 400° C. to 600° C.

The driving layer 110 includes elements for providing signals to the OLED layer 120. The driving layer 110 may include various signal lines, e.g., scan lines (not illustrated), data lines (not illustrated), power lines (not illustrated), and emission lines (not illustrated). The driving layer 110 may further include a plurality of transistors and capacitors. The transistors may include switching transistors (not illustrated) and driving transistors Qd, and the switching transistors and the driving transistors Qd may be provided in their respective pixels (not illustrated).

The OLED layer 120 may include OLEDs. For example, the OLEDs may be provided as top emission-type OLEDs and may emit light in the third direction DR3. Each of the OLEDs may include an anode electrode, an organic layer, and a cathode electrode. The cathode electrode may be a common electrode, but exemplary embodiments are not limited thereto.

Although not specifically illustrated, the OLED layer 120 may be encapsulated by an encapsulation film. The encapsulation film seals the OLED layer 120 and prevents the infiltration of external air and/or moisture into the OLED layer 120. The encapsulation film may be a single-layer or multilayer inorganic film or a stack layer in which an inorganic film and an organic film are alternately stacked.

Although not specifically illustrated, a circuit board (not illustrated) including integrated circuits (ICs) generating signals for driving the display panel 100 and wires transmitting the generated signals may be connected to one end, in the first direction DR1, of the display panel 100. As will be described later, the circuit board may overlap with a part of the display panel 100 in a thickness direction when the display panel 100 is bent.

A support film 500 may be disposed on the bottom surface 100b of the display panel 100.

The support film 500 may prevent the display panel 100 from being bent by an external force or may alleviate the degree to which the display panel 100 is bent by an external force. The support film 500 can maintain the display panel 100 to be relatively flat even when an external force is applied.

The support film 500 may include a rigid or semi-rigid material. Specifically, the support film 500 may be formed of a metal material such as stainless steel (SUS) or aluminum (Al) or a polymer material such as polymethyl methacrylate (PMMA), polycarbonate (PC), polyvinyl alcohol polyvinyl alcohol (PVA), acrylonitrile-butadiene-styrene (ABS), or polyethylene terephthalate (PET). For example, the support film 500 may be an SUS film having a thickness of 150 μm to 200 μm. In another example, the support film 500 may be an Al film having a thickness of 150 μm to 200 μm.

The support film 500 may have a predetermined melting point $T_m$. The melting point $T_m$ of the support film 500 may vary depending on the material of the support film 500, but may generally be 200° C. to 300° C. For example, the melting point $T_m$ of the support film 500 may be lower than the burning point $T_b$ of the base substrate 101.

The support film 500 may include first and second support films 501 and 502, which are separate from each other in the first direction DR1.

The first support film 501 may be disposed in the display area DA not to overlap with the bending area BA. The second support film 502 may be disposed in the non-display area NA not to overlap with the bending area BA. The distance, in the first direction DR1, between the first and second support films 501 and 502 may be greater than the width, in the first direction DR1, of the bending area BA, but exemplary embodiments are not limited thereto. That is, the first and second support films 501 and 502 may be disposed to be aligned with both boundaries of the bending area BA. In this case, the distance, in the first direction DR1, between the first and second support films 501 and 502 may be the same as, or smaller than, the width, in the first direction DR1, of the bending area BA.

The first and second support films 501 and 502 may have the same thickness, but exemplary embodiments are not limited thereto. The width, in the first direction DR1, of the first support film 501 may be greater than the width, in the first direction DR1, of the second support film 502.

The first support film 501 may include a first portion 501a having a relatively flat shape and a second portion 501b disposed adjacent to the first portion 501a in the first direction DR1. The second portion 501b may include a burr projected beyond the first portion 501a in the third direction DR3 and may thus protrude beyond the first portion 501a by as much as a first thickness T1.

Similarly, the second support film 502 may include a third portion 502a having a relatively flat shape and a fourth portion 502b disposed adjacent to the third portion 502a in the first direction DR1. The fourth portion 502b may include a burr projected beyond third portion 502a in the third direction DR3 and may thus protrude beyond the third portion 502a by as much as a second thickness T2.

The burr of the first support film 501 and the burr of the second support film 502 may have an asymmetrical shape. For example, the slope of one side of the burr of the first support film 501 adjacent to the bending area BA may be greater than the slope of the other side of the burr of the first support film 501 distant from the bending area BA. Similarly, the slope of one side of the burr of the second support film 502 adjacent to the bending area BA may be greater than the slope of the other side of the burr of the second support film 502 distant from the bending area BA.

However, in other exemplary embodiments, each of the first and second support films 501 and 502 may not include any burr and may have a flat shape throughout the entire surface thereof.

Inner sides 501bS and 502bS of the first and second support films 501 and 502 may be inclined at a predetermined angle, but exemplary embodiments are not limited thereto. That is, the inner sides 501bS and 502bS of the first and second support films 501 and 502 may have an inclination angle that is substantially a right angle.

Although not specifically illustrated, a housing (not illustrated) may be further disposed on the bottom surface of the support film 500 to support elements disposed on the top surface of the support film 500. The housing disposed on the bottom surface of the support film 500 may be coupled to the support film 500.

An adhesive film 450 may be disposed between the display panel 100 and the support film 500, and the support film 500 may be attached to the display panel 100 through the adhesive film 450.

The adhesive film 450 may have adhesiveness for both the bottom surface 100b of the display panel 100 and top surfaces 503 and 504 of the support film 500.

The adhesive film 450 may be formed of a urethane-based material, an acrylic material, or a silicone-based material. For example, the adhesive film 450 may be a pressure sensitive adhesive (PSA). The adhesive film 450 may have an elongation rate of 100% to 1,000% and may thus be easily bendable along with the display device 1.

The adhesive film 450 may include first and second adhesive films 451 and 452, which are separate from each other in the first direction DR1.

The first adhesive film 451 may be disposed in the display area DA and may be disposed to be aligned with the first boundary BL1 adjacent to the display area DA. The second adhesive film 452 may be disposed in the non-display area NA and may be disposed to be aligned with the second boundary BL2. The distance, in the first direction DR1, between the first and second adhesive films 451 and 452 may be substantially the same as the width, in the first direction DR1, of the bending area BA, but exemplary embodiments are not limited thereto. That is, the first and second adhesive films 451 and 452 may be disposed in the display area DA and the non-display area NA excluding the bending area BA, respectively, without being aligned with both boundaries of the bending area BA. In this case, the distance, in the first direction DR1, between the first and second adhesive films 451 and 452 may be greater than the width, in the first direction DR1, of the bending area BA.

The first and second adhesive films 451 and 452 may have the same thickness, but exemplary embodiments are not limited thereto.

As illustrated in FIG. 3, the display device 1 may be bent downwardly in the opposite direction to the display direction (i.e., a direction toward the bottom surface of the display device 1 in a case where the display device 1 is of a top emission-type), for example, in the opposite direction of the third direction DR3. Since at least part of the non-display area NA can be bent in the opposite direction to the display direction, the bezel of the display device 1 can be reduced.

When the display device 1 is bent as illustrated in FIG. 3, the display device 1 may include a main area MA and a sub-area SA that are both disposed adjacent to the bending area BA. The main area MA may be disposed on at least one side of the bending area BA. The main area MA may be flat. The display area DA may be provided in the main area MA.

The sub-area SA may be parallel to the main area MA. The sub-area SA may overlap with the main area MA in the thickness direction. The sub-area SA may be the non-display area NA, but exemplary embodiments are not limited thereto.

When the display device 1 is bent in one direction, bending stress may be caused. The bending stress may be affected by any residual film on the bottom surface 100b of the display panel 100 in the bending area BA. Specifically, if a residual film, for example, a residual part of the support film 500, remains on the bottom surface 100b of the display panel 100 in the bending area BA, the thickness of the display device 1 may undesirably increase in the bending area BA, and as a result, large bending stress may be generated when the display device 1 is bent. In this case, the display panel 100 may crack, and signal wiring may be disconnected.

However, since no element exists on the bottom surface 100b of the display panel 100 in the bending area BA, stress generated when the display device 1 is bent can be minimized, and as a result, the display panel 100 can be prevented from cracking.

A method of manufacturing a display device according to an exemplary embodiment of the present disclosure will hereinafter be described.

In FIGS. 1 through 10, like reference numerals indicate like elements, and thus, descriptions thereof will be omitted or simplified.

Figure 4:
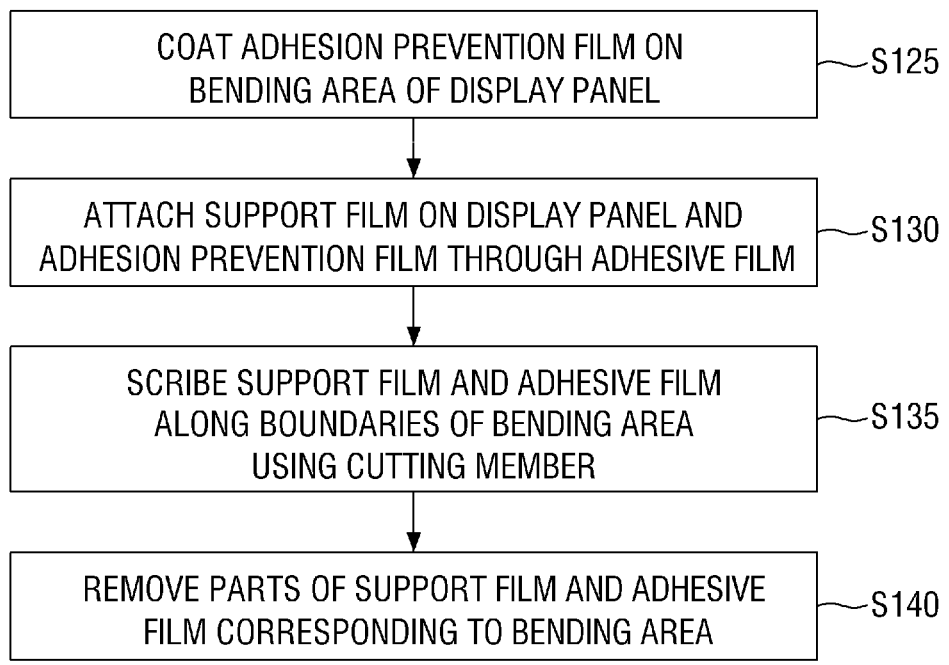
FIG. 4 is a flowchart illustrating a method of manufacturing a display device according to an exemplary embodiment.
Figure 5:
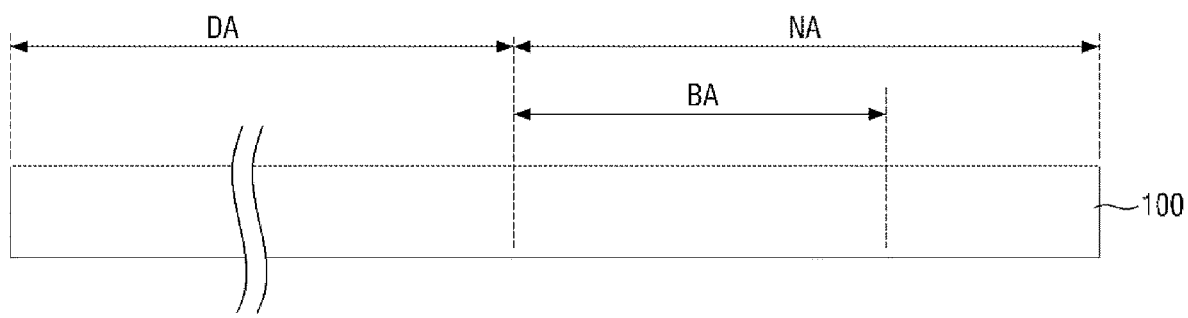
FIGS. 5, 6, 7, 8, 9A, 9B, and 10 are cross-sectional views illustrating the method of FIG. 4.
Figure 5:
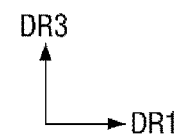
Figure 6:
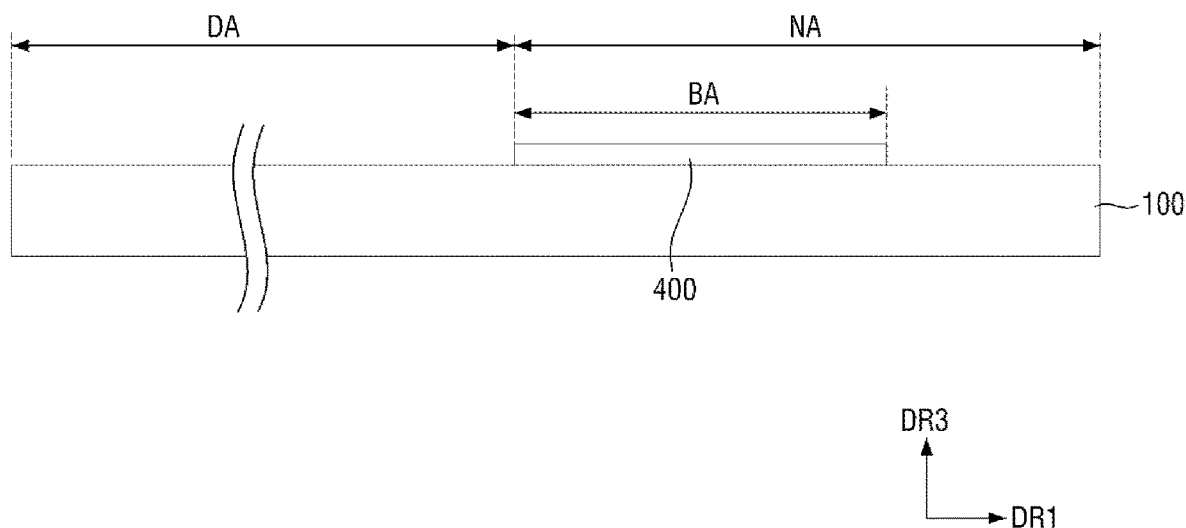
Figure 7:
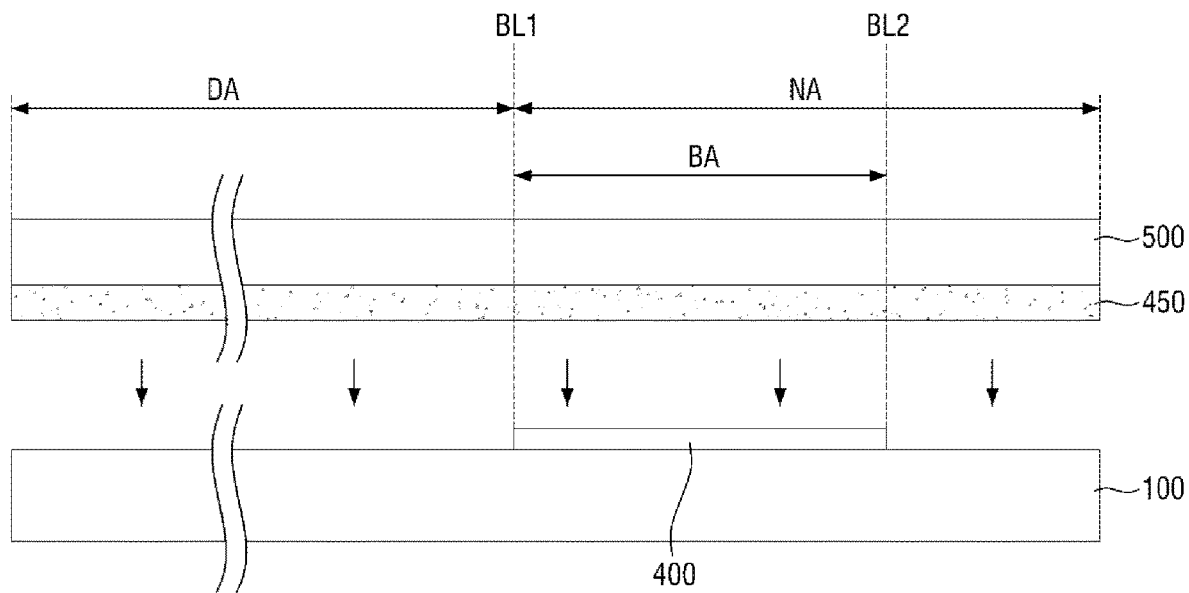
Figure 7:
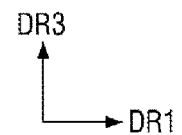
Figure 8:
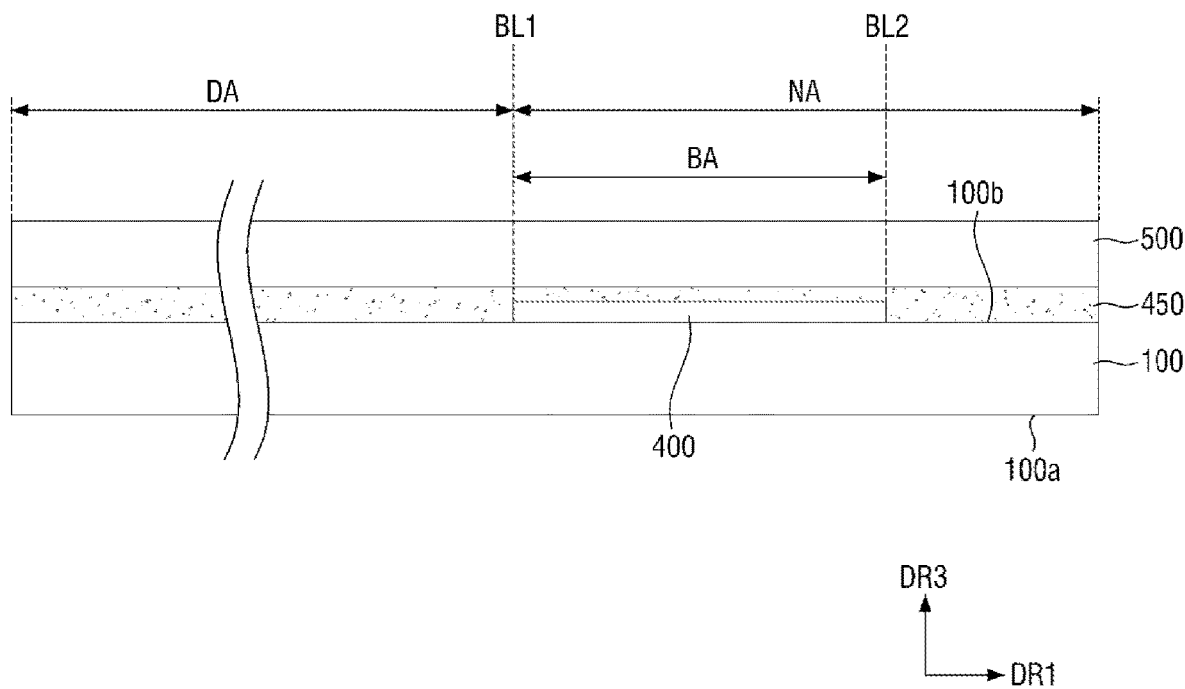

FIG. 4 is a flowchart illustrating a method of manufacturing a display device according to an exemplary embodiment of the present disclosure, and FIGS. 5 through 10 are cross-sectional views illustrating the method of FIG. 4.

Referring to FIGS. 2 and 4 through 6, an adhesion prevention film 400 is coated on the bending area BA of the display panel 100 (S125).

As described above, the display panel 100 may include the base substrate 101, the driving layer 110, and the OLED layer 120. The adhesion prevention film 400 may prevent the adhesive film 450 and the base substrate 101 from being adhered to each other.

In step S125, the adhesion prevention film 400 may be coated on the base substrate 101 of the display panel 100. The adhesion prevention film 400 may be coated by one of slit die coating, dip coating, gravure coating, spin coating, roll coating, bar coating, spray coating, and flow coating.

Before step S125, the adhesion prevention film 400 may be subjected to a surface treatment process to improve its peelability from an interface that it contacts. The surface treatment process is not particularly limited, but may include olefin treatment, silicone treatment, long-chain alkyl treatment, and fluorine treatment. As a result of the surface treatment process, both surfaces of the adhesion prevention film 400 that contact the adhesive film 450 and the top surface 100a of the display panel 100 may include olefin, silicone, long-chain alkyl, or fluorine molecules, and the adhesion of the adhesion prevention film 400 to the adhesive film 450 and the display panel 100 may weaken. Surface treatment substantially the same as, or similar to, anti-fingerprint treatment may further be used.

After step S125, the adhesion prevention film 400 may be coupled to the display panel 100 and the adhesive film 450 with a predetermined bonding force. For example, the adhesion prevention film 400 may be coupled to the display panel 100 and the adhesive film 450 throughout its entire interface with the display panel 100 and the adhesive film 450, but exemplary embodiments are not limited thereto. That is, the adhesion prevention film 400 may be coupled to the display panel 100 and the adhesive film 450 through only a part of its interface with the display panel 100 and the adhesive film 450. The adhesion prevention film 400 may be coupled to the base substrate 101 of the display panel 100 and the adhesive film 450 with different bonding forces.

Referring to FIGS. 2, 4, 7, and 8, the support film 500 is attached onto the display panel 100 and the adhesion prevention film 400 through the adhesive film 450 (S130).

As described above, the support film 500 may include a flexible material. The support film 500 may be attached throughout the entire display area DA and the entire non-display area NA of the display panel 100.

Before step S130, the support film 500 may be in the state of being attached to the adhesive film 450. The support film 500 attached to the adhesive film 450 may be attached to the base substrate 101 of the display panel 100 through the adhesive film 450.

The support film 500 and the adhesive film 450 may be attached using a roller so that the adhesive film 450 can be in contact with the base substrate 101 of the display panel 100.

The support film 500 and the adhesive film 450 may include an overlapping area in which the support film 500 and the adhesive film 450 overlap with the adhesion prevention film 400 in the thickness direction and a non-overlapping area in which the support film 500 and the adhesive film 450 do not overlap with the adhesion prevention film 400 in the thickness direction. In the overlapping area, the display panel 100, the adhesion prevention film 400, the support film 500, and the adhesive film 450 may overlap with one another in the thickness direction. In the non-overlapping area, the display panel 100, the support film 500, and the adhesive film 450 may overlap with one another in the thickness direction.

In an area where the adhesion prevention film 400 is not disposed, the support film 500 may be attached to the base substrate 101 of the display panel 100 through the adhesive film 450.

The adhesion between the adhesive film 450 and the base substrate 101 may be stronger than the adhesion between the adhesion prevention film 400 and the base substrate 101.

In an area where the adhesion prevention film 400 is disposed, the adhesion prevention film 400 may be coupled to each of the base substrate 101 and the adhesive film 450 with a predetermined bonding force. As will be described later, the method of FIG. 4 does not require an additional process for alleviating the adhesion between the support film 500 and the base substrate 101 to remove a part of the support film 500 corresponding to the bending area BA. Accordingly, the bonding force of the adhesive film 450, which is disposed on the entire surface of the base substrate 101, for each of the support film 500 and the adhesion prevention film 400 can be uniformly maintained.

However, in the area where the adhesion prevention film 400 is disposed, the adhesion prevention film 400 may have different bonding forces for the base substrate 101 and the adhesive film 450. Specifically, the bonding force of the adhesion prevention film 400 for the adhesive film 450 may be greater than the bonding force of the adhesion prevention film 400 for the base substrate 101. Accordingly, the adhesion prevention film 400 may be removed after a scribing process by being coupled to the adhesive film 450. This will be described later in detail.

Referring to FIGS. 2, 4, 9A, and 9B, the support film 500 and the adhesive film 450 are scribed along the boundaries (BL1 and BL2) of the bending area BA using a cutting member 600 (S135).

Figure 9A:
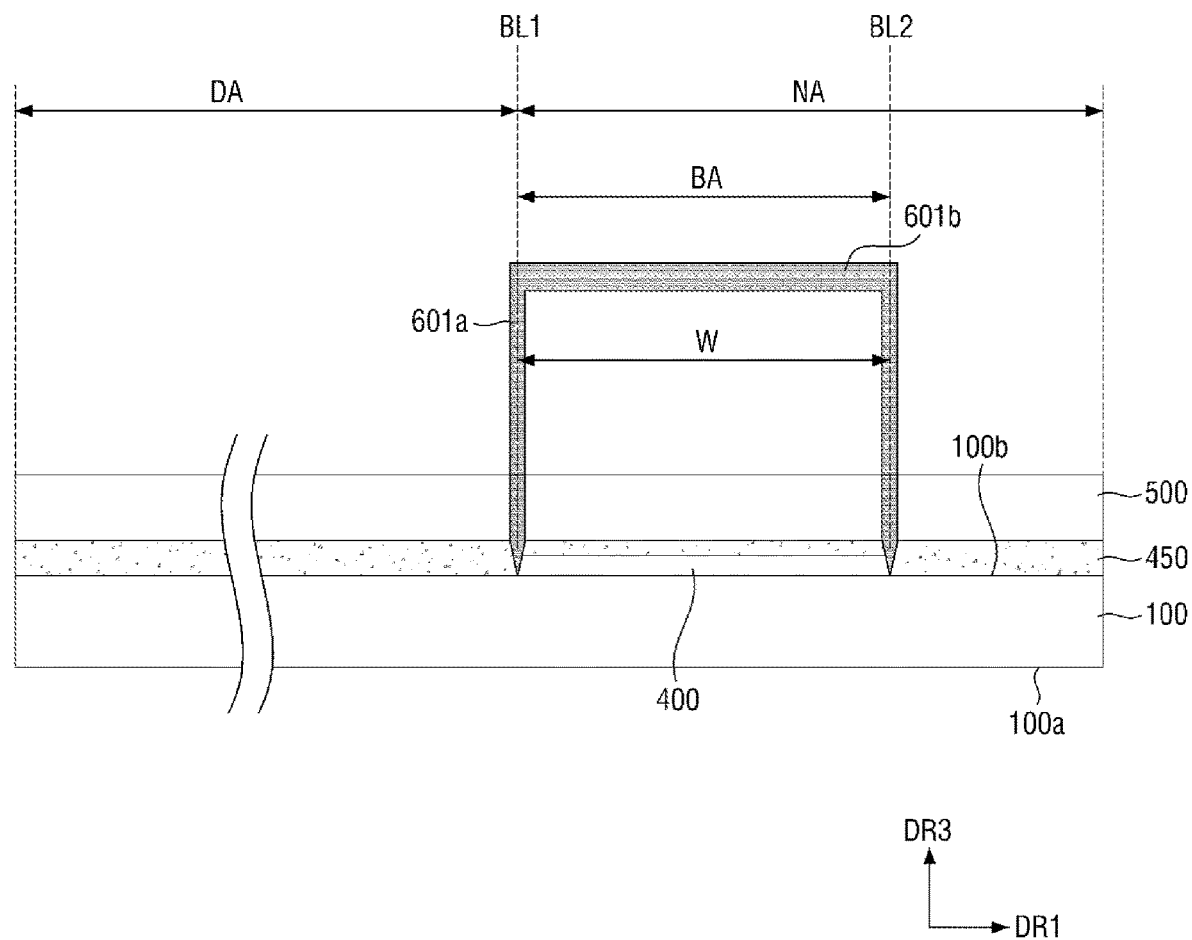

In step S135, the cutting member 600 may be a heat knife 601 as illustrated in FIG. 9A. The heat knife 601 may include at least one cutting part 601a cutting the support film 500 and the adhesive film 450 and a supporting part 601b supporting the cutting part 601a. The heat knife 601 is illustrated as including two cutting parts 601a disposed on a single supporting part 601b, but exemplary embodiments are not limited thereto. That is, the heat knife 601 may include one or three or more cutting parts 601a.

Figure 9B:
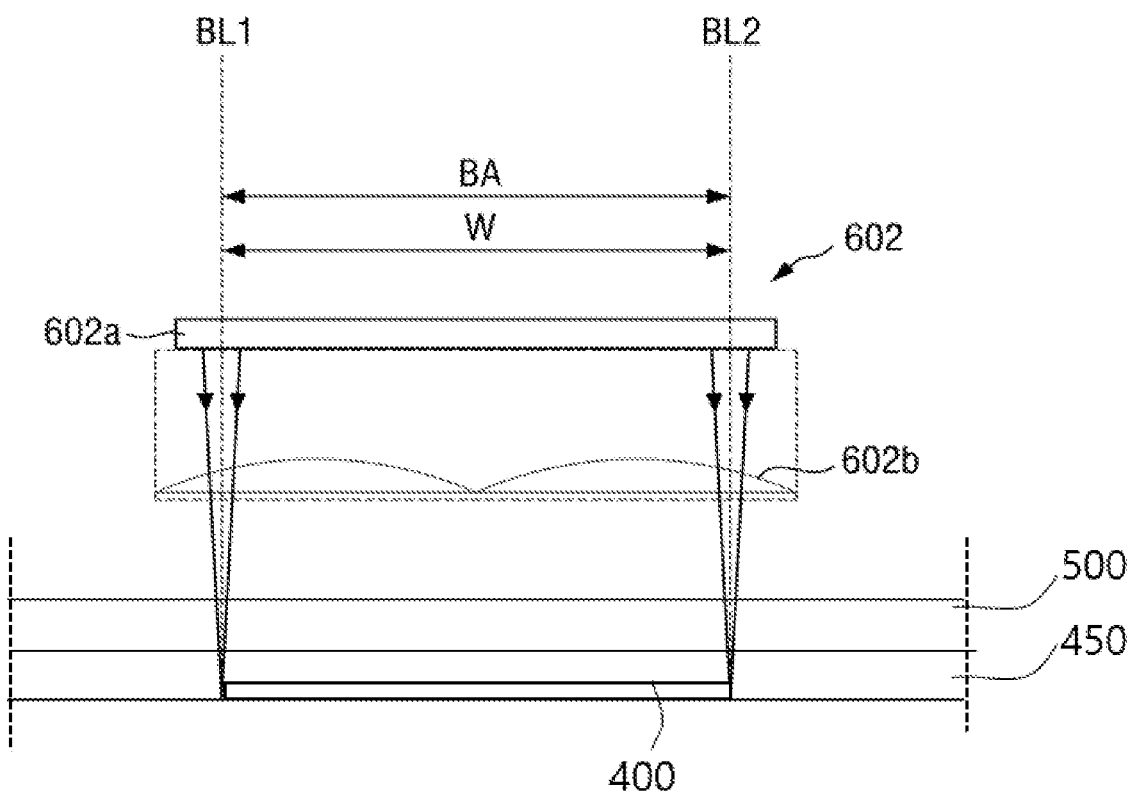

In some exemplary embodiments, the cutting member 600 may be a laser member 602 as illustrated in FIG. 9B. The laser member 602 may include a light source 602a emitting light and a lens 602b refracting laser emitted by the light source 602a. The laser emitted by the light source 602a may be in the range of ultraviolet (UV) wavelengths, but exemplary embodiments are not limited thereto. The laser member 602 may include a spot laser. For example, the laser member 602 may refract laser emitted by the light source 602a through the lens 602b and may apply the refracted laser to the boundaries (BL1 and BL2) of the bending area BA. In a case where a spot laser is used, the areas and/or the thicknesses of the burrs of the first and second support films 501 and 502 may become smaller because a region irradiated with laser is narrower than a region cut by the heat knife 601.

In step S135, the cutting member 600 may perform scribing along both the first and second boundaries BL1 and BL2 at the same time. A cutting width W of the cutting member 600, which corresponds to the distance between the first and second boundaries BL1 and BL2, may be substantially the same as the width of the bending area BA. In this manner, the support film 500 and the adhesive film 450 can be scribed along the boundaries (BL1 and BL2) of the bending area BA at the same time. In a case where the cutting member 600 performs scribing along the first and second boundaries BL1 and BL2 at the same time, scribing error can be reduced, and processing time can also be reduced.

Alternatively, in step S135, the cutting member 600 may perform scribing along the first and second boundaries BL1 and BL2 at an interval of a predetermined amount of time. For example, the cutting member 600 may perform scribing along the first boundary BL1 and then along the second boundary BL2. In another example, the cutting member 600 may perform scribing along the second boundary BL2 and then along the first boundary BL1.

In step S135, scribing can be performed only on the support film 500 and the adhesive film 450 by controlling the scribing strength and duration of the cutting member 600.

Figure 10:
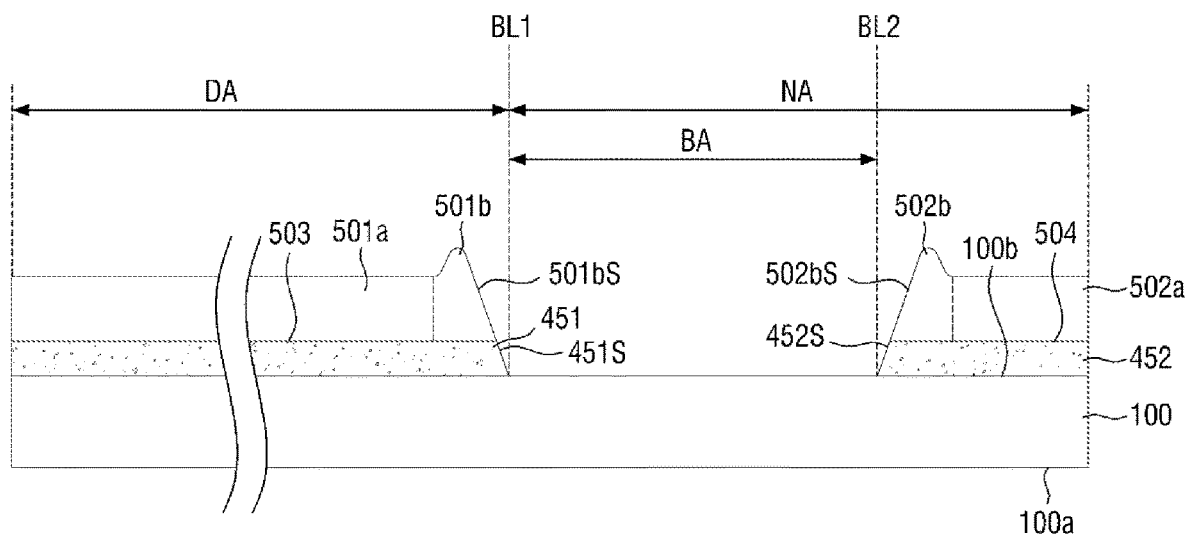

Referring to FIGS. 2, 4, and 10, parts of the support film 500 and the adhesive film 450 corresponding to the bending area BA are removed (S140).

After step S140, the parts of the support film 500 and the adhesive film 450 corresponding to the first and second boundaries BL1 and BL2 and the adhesion prevention film 400 may be removed. As described above, in the area where the adhesion prevention film 400 is not disposed, the base substrate 101 of the display panel 100, the adhesive film 450, and the support film 500 overlap with one another in the thickness direction, and the base substrate 101 and the support film 500 are attached to each other through the adhesive film 450.

On the other hand, in the area where the adhesion prevention film 400 is disposed, the base substrate 101 of the display panel 100, the adhesion prevention film 400, the adhesive film 450, and the support film 500 overlap with one another in the thickness direction.

As described above, the bonding force of the adhesion prevention film 400 for the adhesive film 450 may be greater than the bonding force of the adhesion prevent film 400 for the base substrate 101. As a result, when the support film 500 is cut in the bending area BA after the scribing process, the adhesion prevention film 400 can be separated from the base substrate 101 while being attached to the adhesive film 450, and thus, the cutting of the support film 500 in the bending area BA can be facilitated. Accordingly, an additional process for removing any residual adhesive ingredients from above the base substrate 101 is unnecessary, which is highly efficient in terms of processing time and cost.

In addition, the display panel 100 including the base substrate 101 may be physically damaged in the process of removing any residual adhesive ingredients from above the base substrate 101. However, as described above, since the adhesion prevention film 400 is disposed between the base substrate 101 and the adhesive film 450, such damage to the display panel 100 can be effectively prevented.

Other exemplary embodiments of the present disclosure will hereinafter be described. In FIGS. 1 through 14, like reference numerals indicate like elements, and thus, descriptions thereof will be omitted or simplified.

Figure 11:
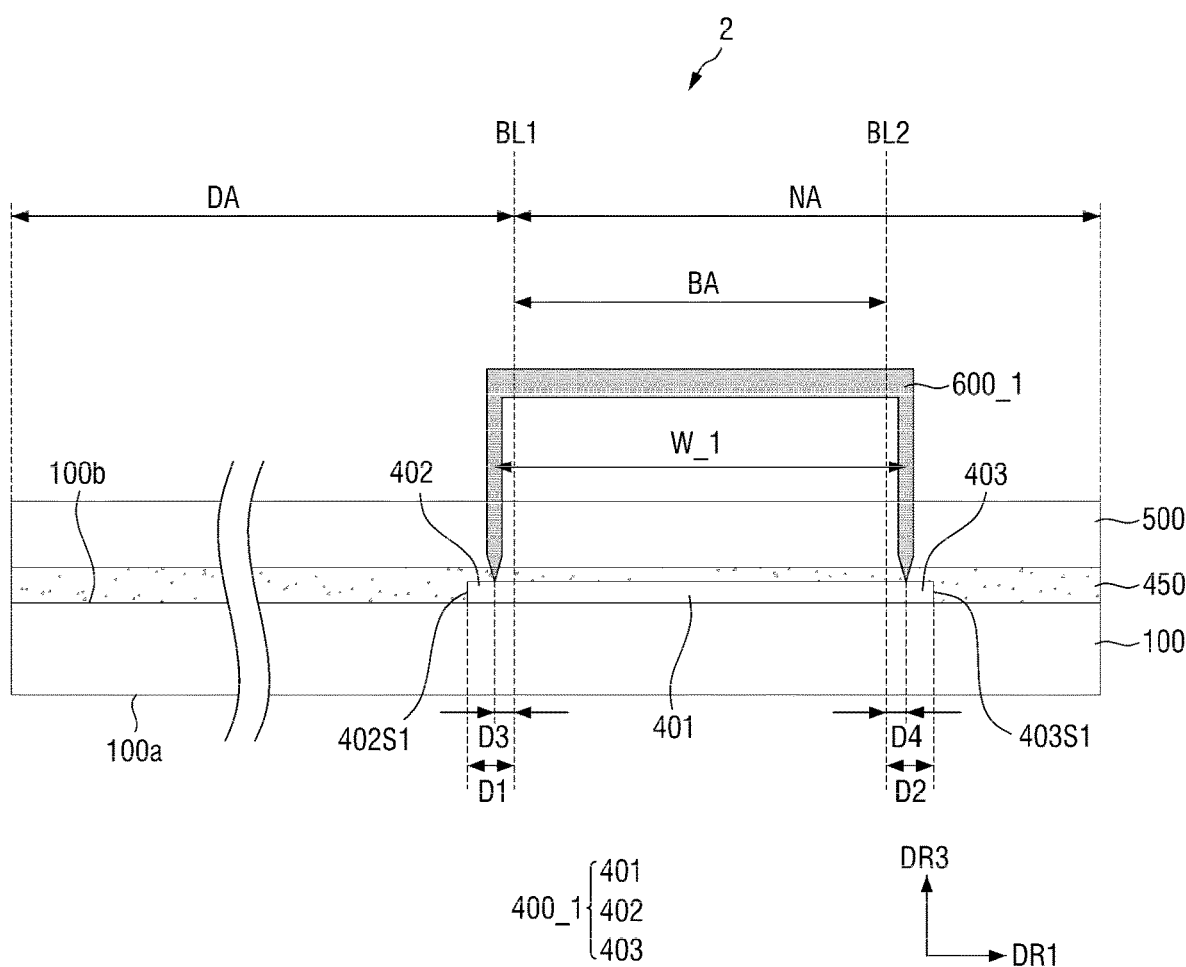
FIG. 11 is a cross-sectional view illustrating a method of manufacturing a display device according to another exemplary embodiment.
Figure 12:
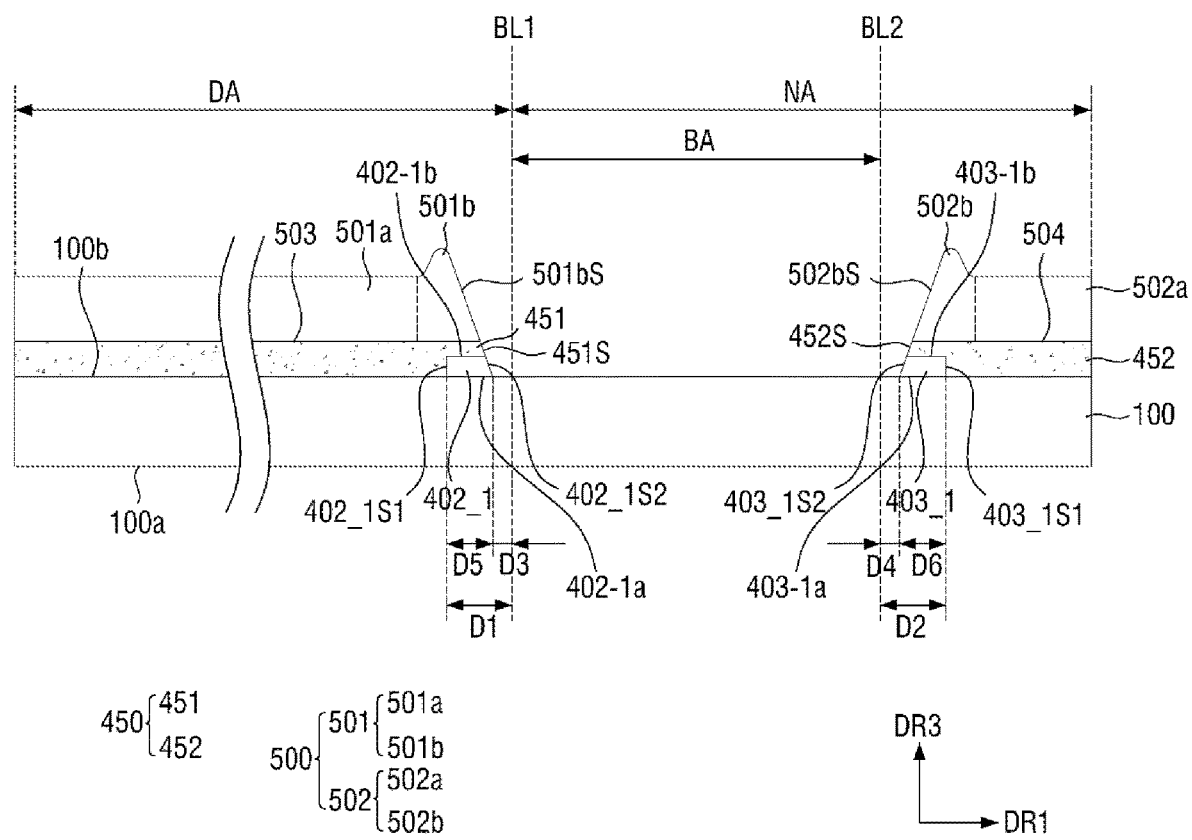
FIG. 12 is a cross-sectional view of an exemplary display device that can be obtained by the method of FIG. 11.
Figure 13:
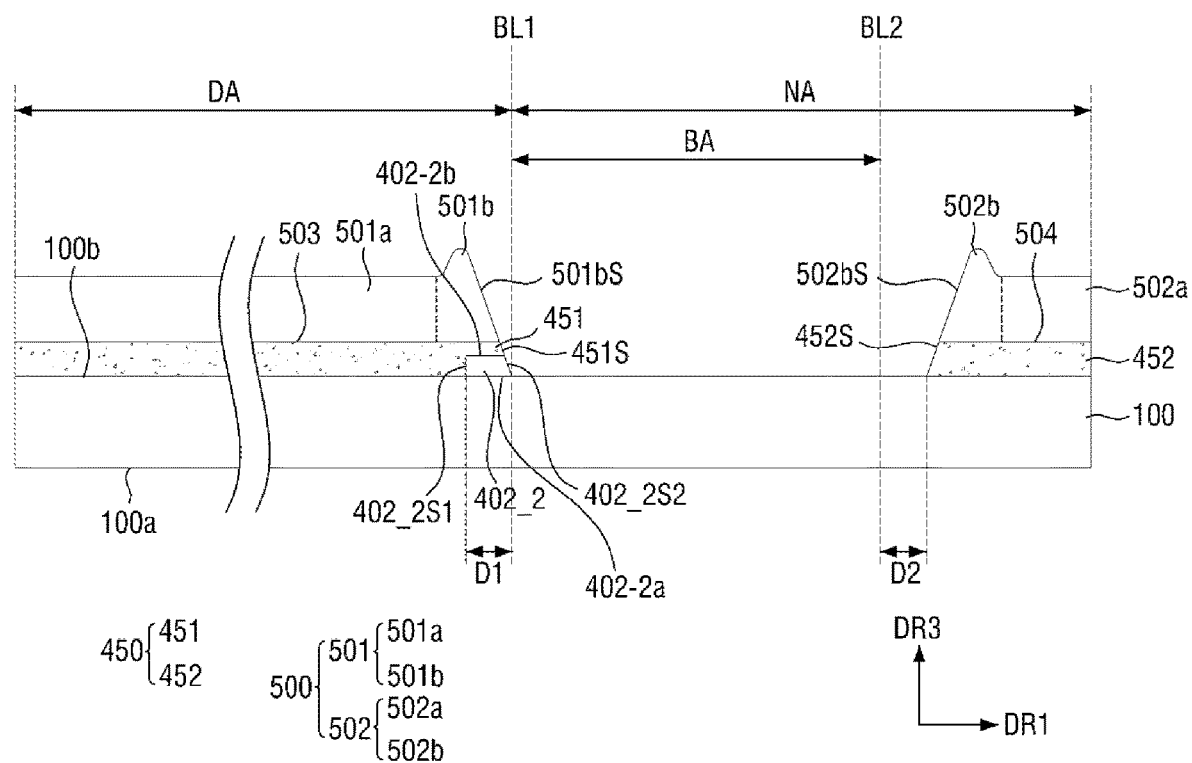
FIG. 13 is a cross-sectional view of another exemplary display device that can be obtained by the method of FIG. 11.
Figure 14:
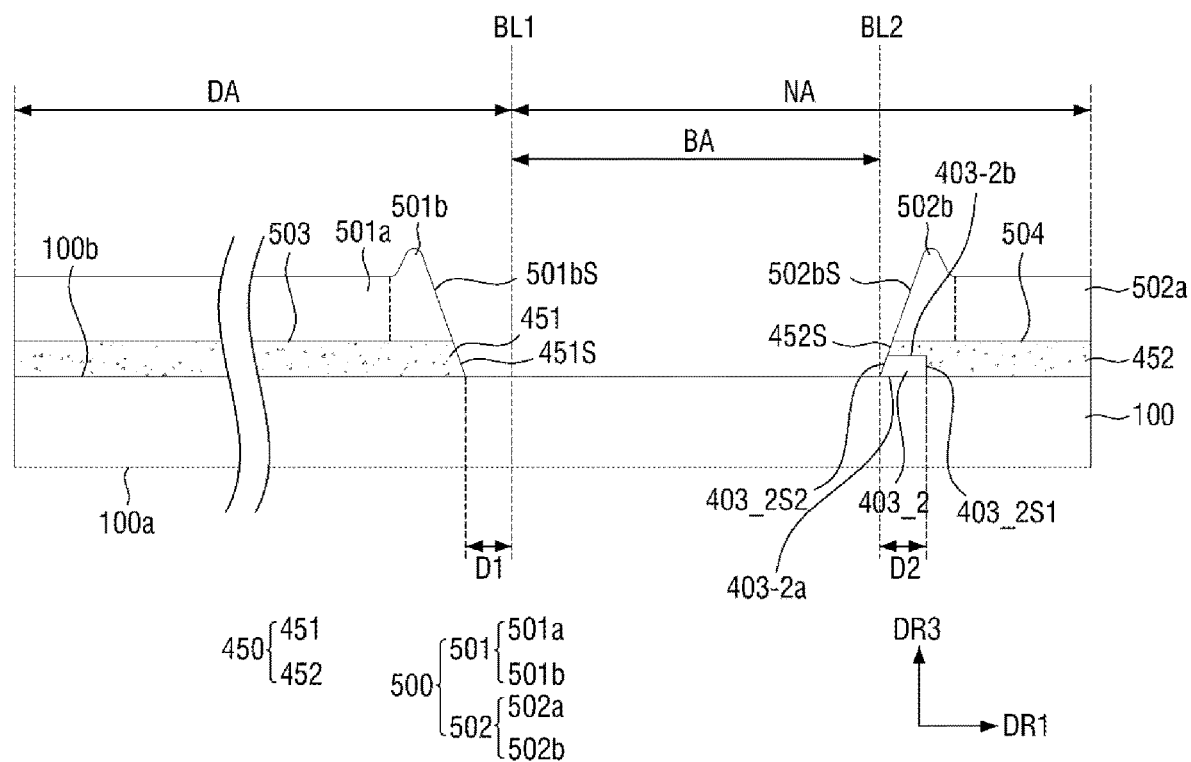
FIG. 14 is a cross-sectional view of another exemplary display device that can be obtained by the method of FIG. 11.

FIG. 11 is a cross-sectional view illustrating a method of manufacturing a display device according to another exemplary embodiment of the present disclosure, and FIGS. 12 through 14 are cross-sectional views of display devices according to other exemplary embodiments of the present disclosure. Specifically, FIGS. 12 through 14 are cross-sectional views of exemplary display devices that can be obtained by the method of FIG. 11.

Referring to FIGS. 11, 12, 13, and 14, a display device 2 differs from the display device 1 in that an adhesion prevention film 400_1 is disposed to extend outwardly beyond both first and second boundaries BL1 and BL2, a cutting width W_1 of a cutting member 600_1 is increased, and the scribing range of the cutting member 600_1 includes the first and second boundaries BL1 and BL2 and also includes parts on the outside of the first and second boundaries BL1 and BL2.

Specifically, the adhesion prevention film 400_1 may be disposed to extend outwardly beyond the first and second boundaries BL1 and BL2. The adhesion prevention film 400_1 may include first adhesion prevention film 401, second adhesion prevention film 402, and third adhesion prevention film 403. The second adhesion prevention film 402 may have a first width D1 on the outside of the first boundary BL1 in the first direction DR1. The third adhesion prevention film 403 may have a second width D2 on the outside of the second boundary BL2 in the first direction DR1.

The first and second widths D1 and D2 may be the same, but exemplary embodiments are not limited thereto. That is, the first and second widths D1 and D2 may not be the same, and the first width D1 may be greater or smaller than the second width D2.

The cutting member 600_1 may perform scribing along the first and second boundaries BL1 and BL2 and/or on the outside of the first and second boundaries BL1 and BL2. For example, the cutting member 600_1 may perform scribing between the first boundary BL1 and the outer side 402S1 of the second adhesion prevention film 402 in the first direction DR1 and between the second boundary BL2 and the outer side 403S1 of the third adhesion prevention film 403 in the first direction DR1.

FIG. 12 is a cross-sectional view of a display device 2 obtained by perform scribing between the first boundary BL1 and an outer side 402_1S1 of the second adhesion prevention film 402 and between the second boundary BL2 and an outer side 403_1S1 of the third adhesion prevention film 403 and then performing cutting. Referring to FIG. 12, parts of the second and third adhesion prevention films 402 and 403, i.e., fourth and fifth adhesion prevention films 402_1 and 403_1, may remain.

Specifically, the fourth and fifth adhesion prevention films 402_1 and 403_1 may include the same material. The fourth adhesion prevention film 402_1 may include a first surface 402_1a adhered to the base substrate 101, a second surface 402_1b opposite to the first surface 402_1a and covered by the first adhesive film 451, a first side 402_1S1 covered by the first adhesive film 451, and a second side 402_1S2 opposite to the first side 402_1S1 and facing the bending area BA. Similarly, the fifth adhesion prevention film 403_1 may include a first surface 403_1a adhered to the base substrate 101, a second surface 403_1b opposite to the first surface 403_1a and covered by the first adhesive film 451, a first side 403_1S1 covered by the first adhesive film 451, and a second side 403_1S2 opposite to the first side 402_1S1 and facing the bending area BA.

For example, a width D5 of the fourth adhesion prevention film 402_1 and a width D6 of the fifth adhesion prevention film 403_1 may be the same, but exemplary embodiments are not limited thereto. That is, the widths D5 and D6 may not be the same, and the width D5 may be greater or smaller than the width D6.

Inner sides 402_1S2 and 403_1S2 of the fourth and fifth adhesion prevention films 402_1 and 403_1 may be inclined at a predetermined angle, but exemplary embodiments are not limited thereto. The inner sides 402_1S2 and 403_1S2 of the fourth and fifth adhesion prevention films 402_1 and 403_1 may have an inclination angle that is substantially a right angle.

The inner sides 402_1S2 and 403_1S2 of the fourth and fifth adhesion prevention films 402_1 and 403_1 may be aligned with inner sides 451S and 452S, respectively, of the first and second adhesive films 451 and 452. Also, the inner sides 402_1S2 and 403_1S2 of the fourth and fifth adhesion prevention films 402_1 and 403_1 may be aligned with the inner sides 501bS and 502bS, respectively, of the first and second support films 501 and 502. Also, the inner sides 402_1S2 and 403_1S2 of the fourth and fifth adhesion prevention films 402_1 and 403_1 may be aligned with the first and second boundaries BL1 and BL2 of the bending area BA.

FIG. 13 is a cross-sectional view of a display device 2 obtained by perform scribing along the first boundary BL1 and along the outer side of the third adhesion prevention film 403 in the first direction DR1 and then performing cutting.

Referring to FIG. 13, a part of the second adhesion prevention film 402, i.e., a sixth adhesion prevention film 402_2, may remain.

The width, in the first direction DR1, of the sixth adhesion prevention film 402_2 may be the same as the first width D1.

An inner side 402_2S2 of the sixth adhesion prevention film 402_2 may be inclined at a predetermined angle, but exemplary embodiments are not limited thereto. That is, the inner side 402_2S2 of the sixth adhesion prevention film 402_2 may have an inclination angle that is substantially a right angle.

FIG. 14 is a cross-sectional view of a display device 2 obtained by perform scribing along the second boundary BL2 and along the outer side of the second adhesion prevention film 402 in the first direction DR1 and then performing cutting. Referring to FIG. 14, a part of the third adhesion prevention film 403, i.e., a seventh adhesion prevention film 403_2, may remain.

The width, in the first direction DR1, of the seventh adhesion prevention film 403_2 may be the same as the second width D2.

An inner side 403_2S2 of the seventh adhesion prevention film 403_2 may be inclined at a predetermined angle, but exemplary embodiments are not limited thereto. That is, the inner side 403_2S2 of the seventh adhesion prevention film 403_2 may have an inclination angle that is substantially a right angle.

In a case where scribing is performed on the support film 500 using the cutting member 600_1, the support film 500 may not be completely removed from the bending area BA because of alignment error of the cutting member 600_1.

However, if the adhesion prevention film 400_1 is provided on both sides of the bending area BA and the width of the cutting member 600_1 is increased, the scribing range of the cutting member 600_1 can be widened. Specifically, the scribing range of the cutting member 600_1 may include a part between the first boundary BL1 and the outer side of the second adhesion prevention film 402 in the first direction DR1 and a part between the second boundary BL2 and the outer side of the third adhesion prevention film 403 in the first direction DR1. Since the scribing range of the cutting member 600_1 can be widened, defects that may be caused by scribing error of the cutting member 600_1 can be prevented.

Since the adhesion prevention film 400_1 is attached to the adhesive film 450 and is separated from the base substrate 101 when the support film 500 is cut in the bending area BA after the scribing process, the cutting of the support film 500 can be facilitated. Therefore, an additional process for removing any residual adhesive ingredients from above the base substrate 101 is unnecessary, which is highly efficient in terms of processing time and cost.

In addition, in the process of removing any residual adhesive ingredients from above the base substrate 101, the display panel 100 including the base substrate 101 may be physically damaged. However, since the adhesion prevention film 400_1 is disposed between the base substrate 101 and the adhesive film 450, such damage to the display panel 100 can be effectively prevented.

Figure 15:
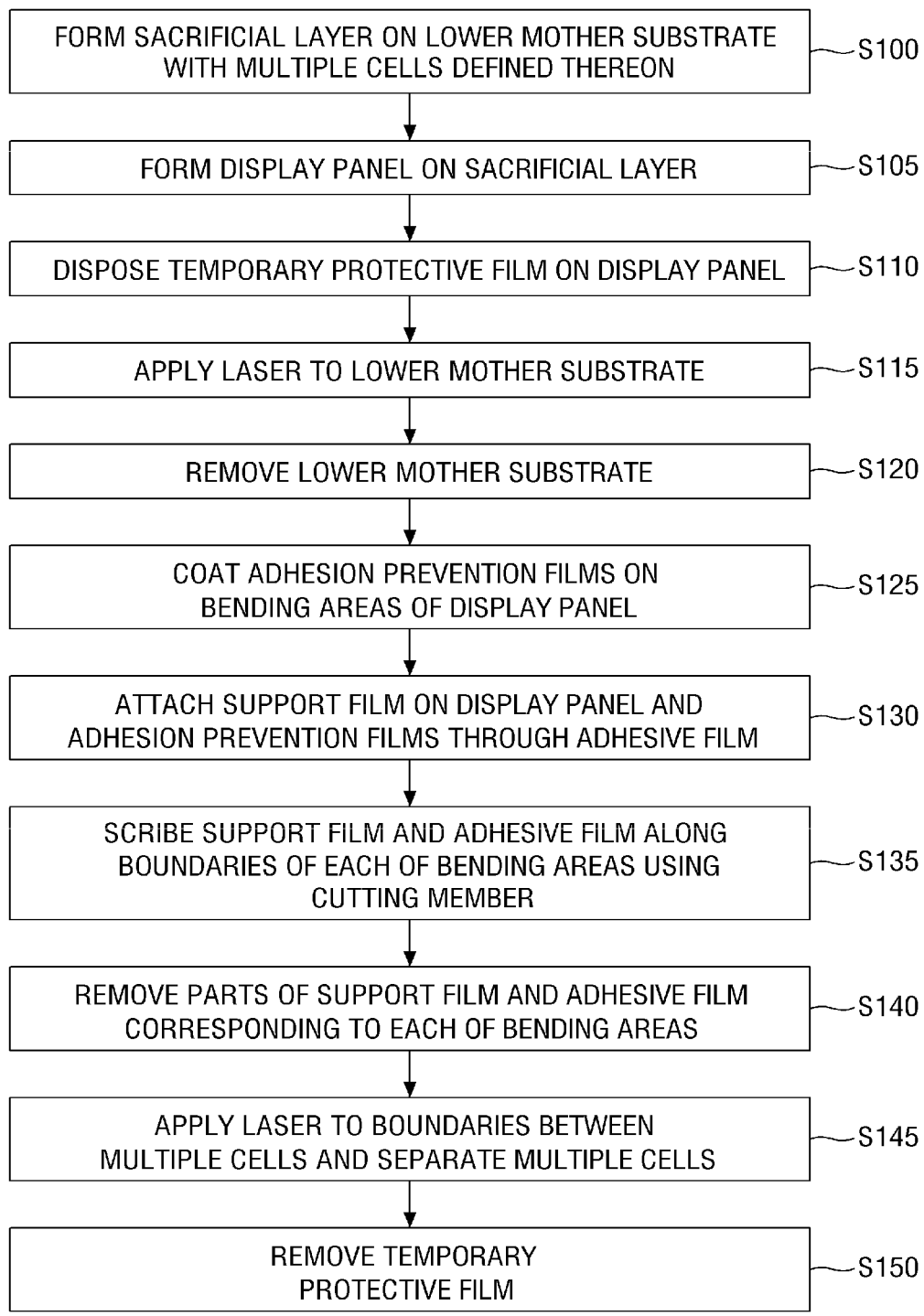
FIG. 15 is a flowchart illustrating a method of manufacturing a display device according to another exemplary embodiment.
Figure 16:
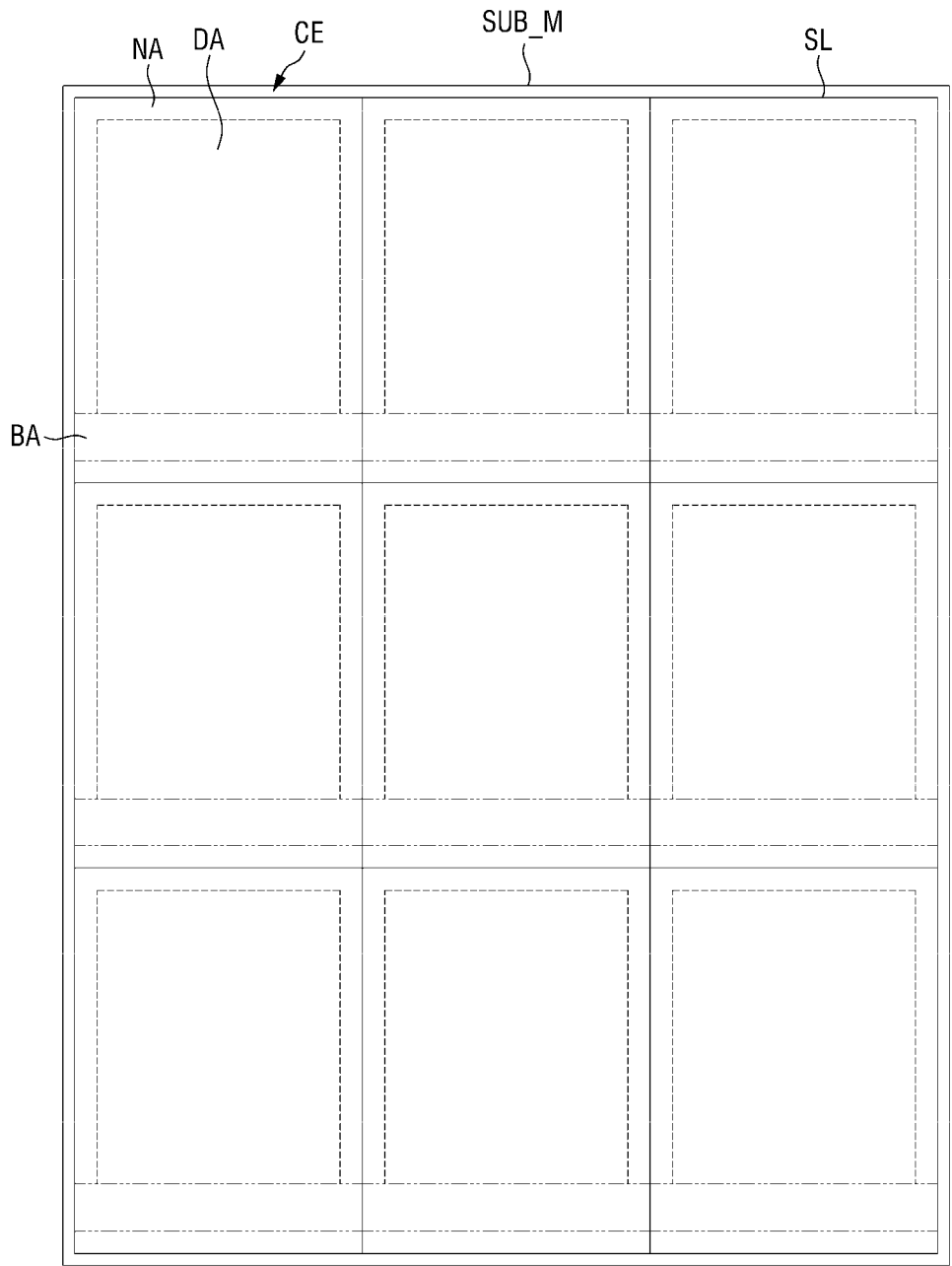
FIG. 16 is a layout view illustrating a method of manufacturing a display device according to another exemplary embodiment.
Figure 16:
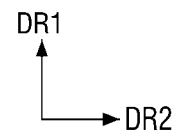
Figure 26:
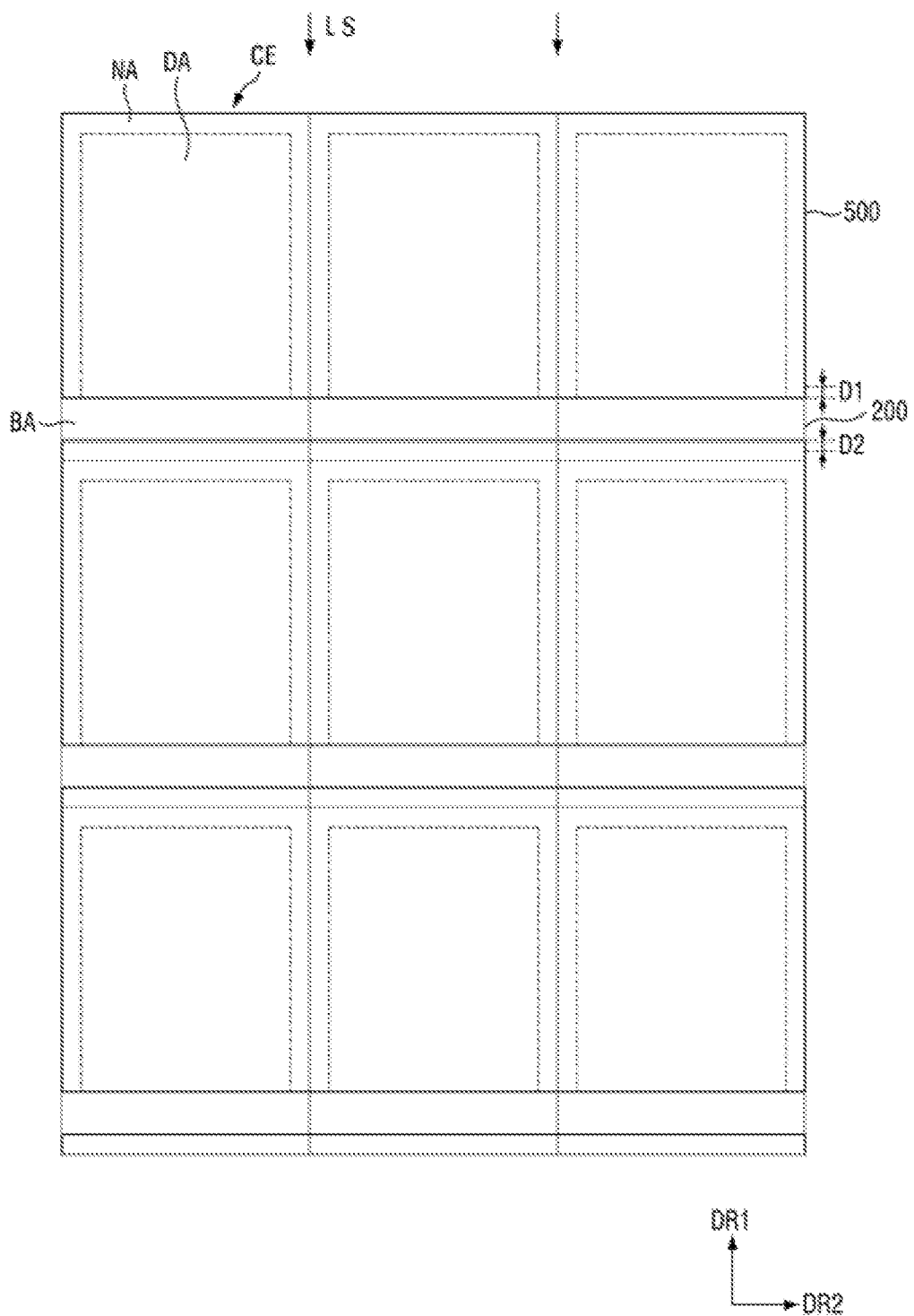
Figure 27:
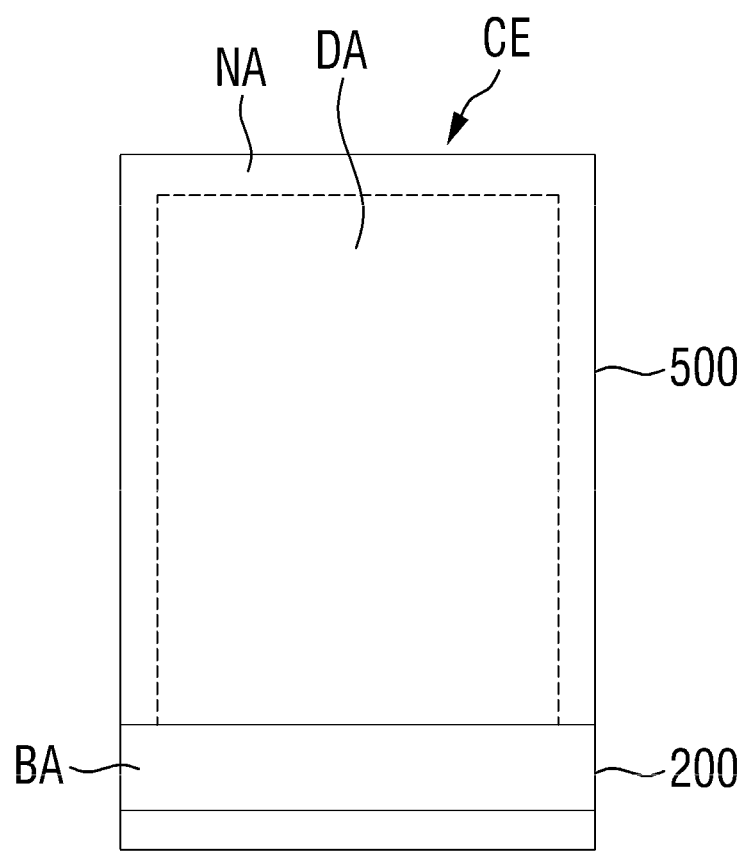
FIGS. 27 and 28 are layout views or cross-sectional views illustrating processes that follow the process of FIG. 26.
Figure 28:
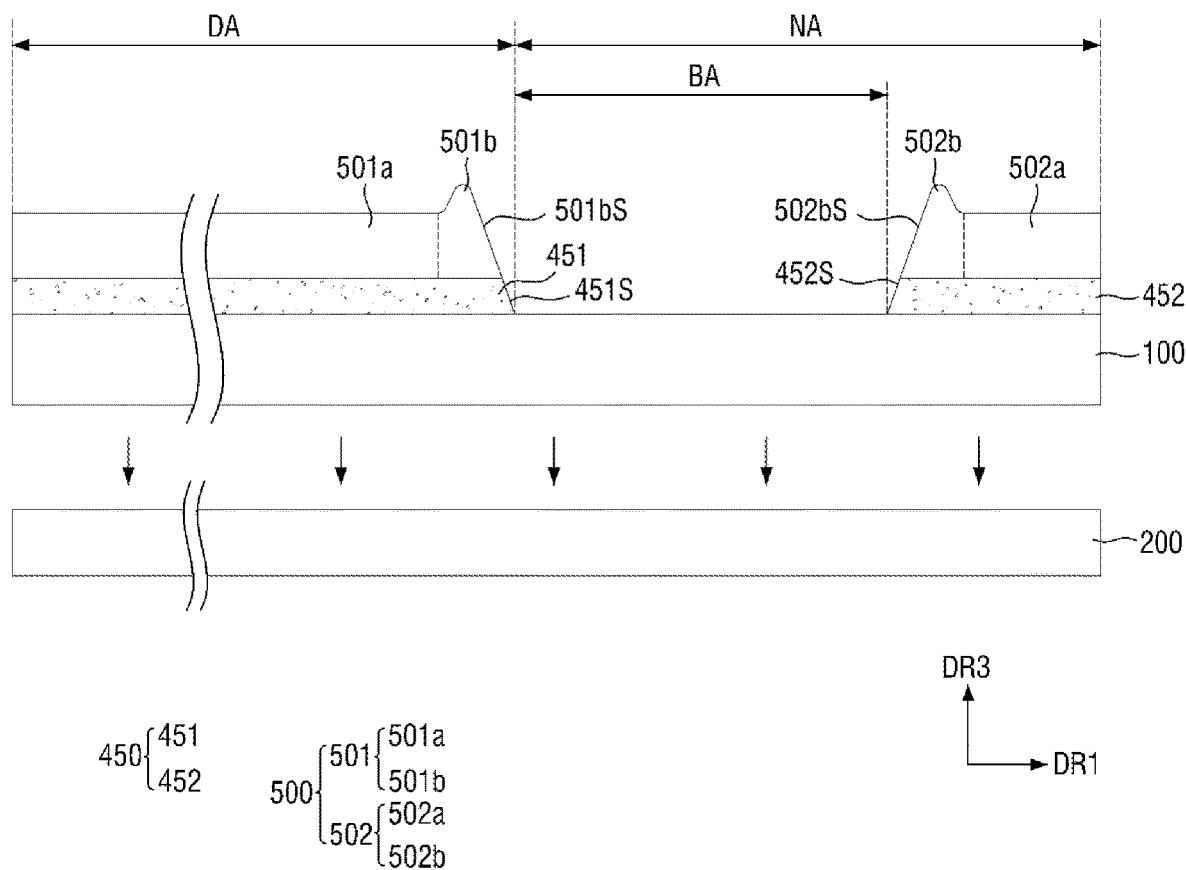

FIG. 15 is a flowchart illustrating a method of manufacturing a display device according to another exemplary embodiment of the present disclosure. FIG. 16 is a layout view illustrating a method of manufacturing a display device according to another exemplary embodiment of the present disclosure. FIGS. 17 through 21 are cross-sectional views, taken along in the first direction of FIG. 16, illustrating the method of FIG. 16. FIGS. 22 through 26 are layout views or perspective views illustrating processes that follow the method of FIG. 16. FIGS. 27 and 28 are layout views or cross-sectional views illustrating processes that follow the process of FIG. 26.

Specifically, FIGS. 15 through 28 illustrate an exemplary mother substrate-based display device fabrication method. In FIGS. 4 through 10 and 15 through 28, like reference numerals indicate like elements, and thus, descriptions thereof will be omitted or simplified. The method of FIGS. 15 through 20 will hereinafter be described, focusing mainly on differences with the method of FIGS. 4 through 10.

Figure 17:
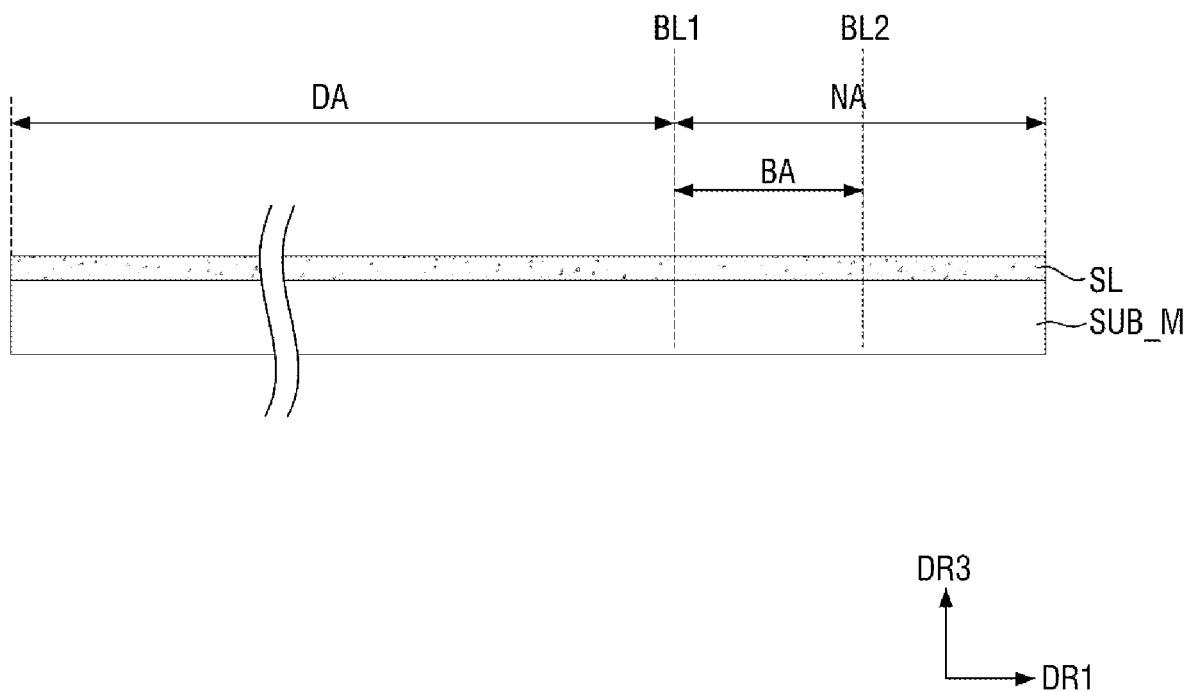
FIGS. 17, 18, 19, 20, and 21 are cross-sectional views, taken along in a first direction of FIG. 16, illustrating the method of FIG. 16.

Referring to FIGS. 15, 16, and 17, a sacrificial layer SL is formed on a lower mother substrate SUB_M with a plurality of cells CE defined thereon (S100).

The lower mother substrate SUB_M may be used to fabricate a plurality of display devices at the same time and may support a plurality of display devices stacked thereon. The cells CE may be defined on the lower mother substrate SUB_M. Each of the cells CE may correspond to a display device 1. FIG. 16 illustrates only nine cells CE, but the number of cells CE is not particularly limited.

Each of the cells CE may include a display area DA and a non-display are NA disposed on the periphery of the display area DA, and the non-display area NA may include a bending area BA that can be bent.

The cells CE may be continuously disposed. That is, the bending areas BA of each pair of adjacent cells CE in one direction may be disposed adjacent to each other.

The lower mother substrate SUB_M may be a rigid substrate. For example, the lower mother substrate SUB_M may include glass or quartz, but exemplary embodiments are not limited thereto.

The sacrificial layer SL may be disposed on the entire surface of the lower mother substrate SUB_M. The sacrificial layer SL may protect a display panel 100 to be disposed thereon.

The sacrificial layer SL is illustrated as having a smaller area than the lower mother substrate SUB_M in a plan view, but exemplary embodiments are not limited thereto. That is, the sacrificial layer SL may have substantially the same area as the lower mother substrate SUB_M. The sacrificial layer SL may be coupled to a base substrate 101 that will be described later. The sacrificial layer SL may be coupled to the base substrate 101 through an adhesive film (not illustrated) disposed the sacrificial layer SL and the base substrate 101. The adhesive film may include a material whose adhesiveness weakens in response to laser being applied thereto during a peeling process that will be described later. For example, the adhesive film may include a UV-curable adhesive material. Alternatively, the sacrificial layer SL may be coupled to the base substrate 101 without the aid of the adhesive film.

The sacrificial layer SL may have a structure in which a silicon nitride ($SiN_x$) layer and a silicon oxide ($SiO_x$) layer are stacked, but exemplary embodiments are not limited thereto.

Figure 18:
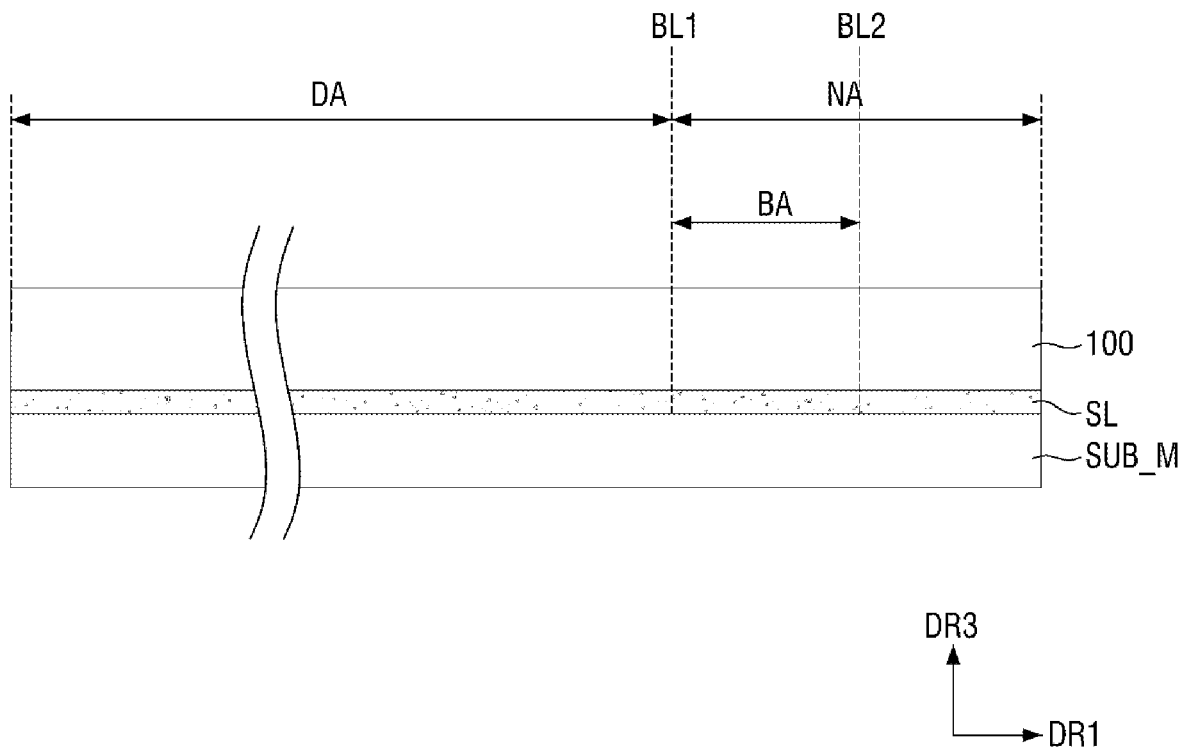

Referring to FIGS. 2, 15, and 18, the display panel 100 is formed on the sacrificial layer SL (S105). As illustrated in FIG. 2, the base substrate 101 of the display panel 100 may be disposed on the sacrificial layer SL.

Figure 19:
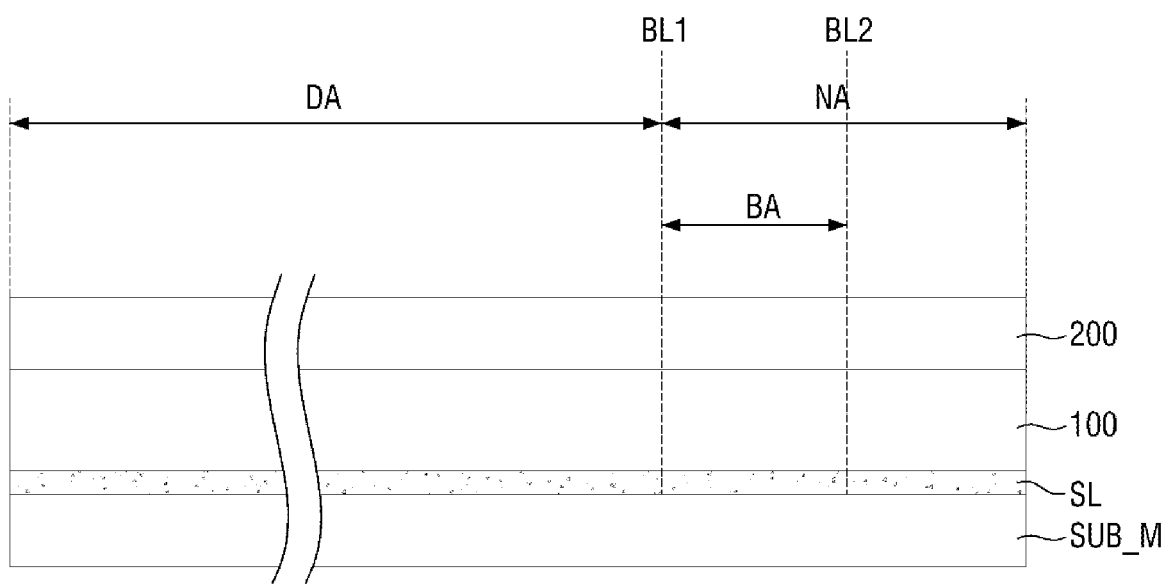

Referring to FIGS. 2, 15, and 19, a temporary protective film 200 is disposed on the display panel 100 corresponding to the lower mother substrate SUB_M (S110). The temporary protective film 200 may protect the display panel 100 during the fabrication of each display device. As will be described later, the temporary protective film 200 may be removed by a peeling process after cutting each of the cells CE.

The temporary protective film 200 may be a flexible film. For example, the temporary protective film 200 may be formed of PET, but exemplary embodiments are not limited thereto. The temporary protective film 200 may be attached onto the display panel 100 through an adhesive film (not illustrated).

Figure 20:
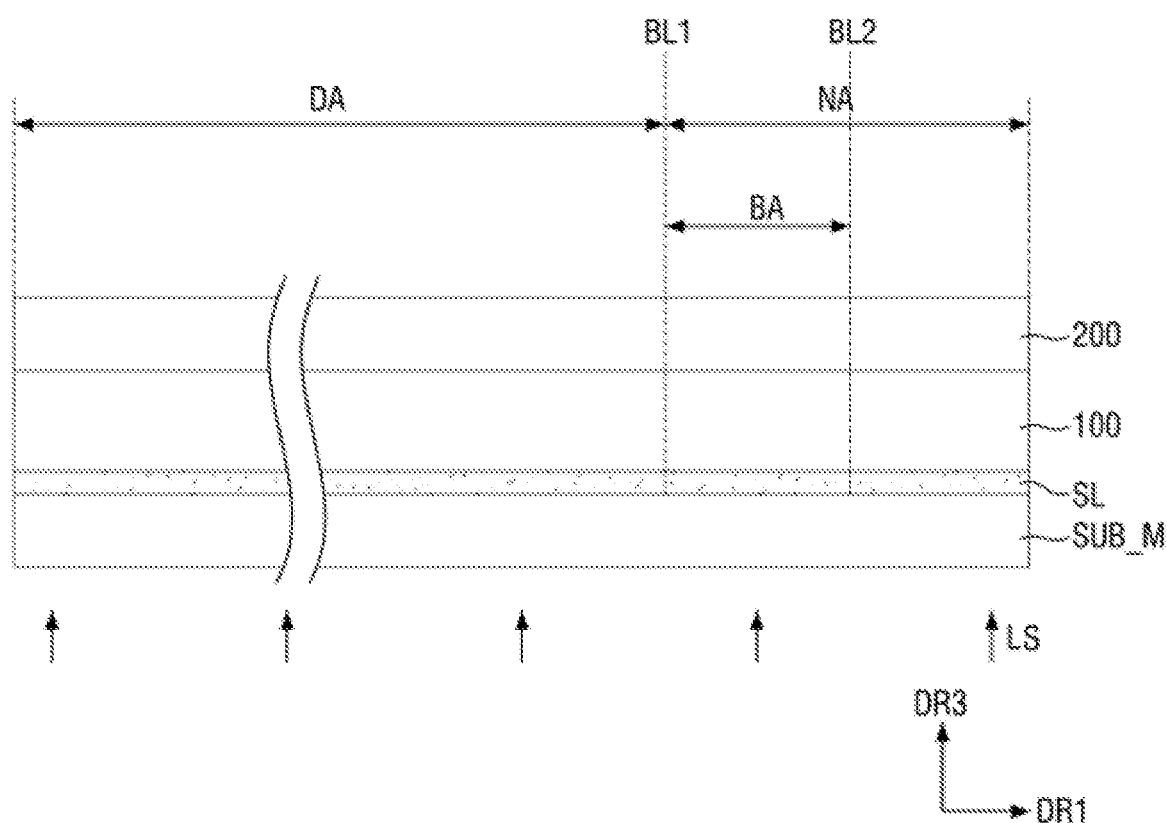
Figure 21:
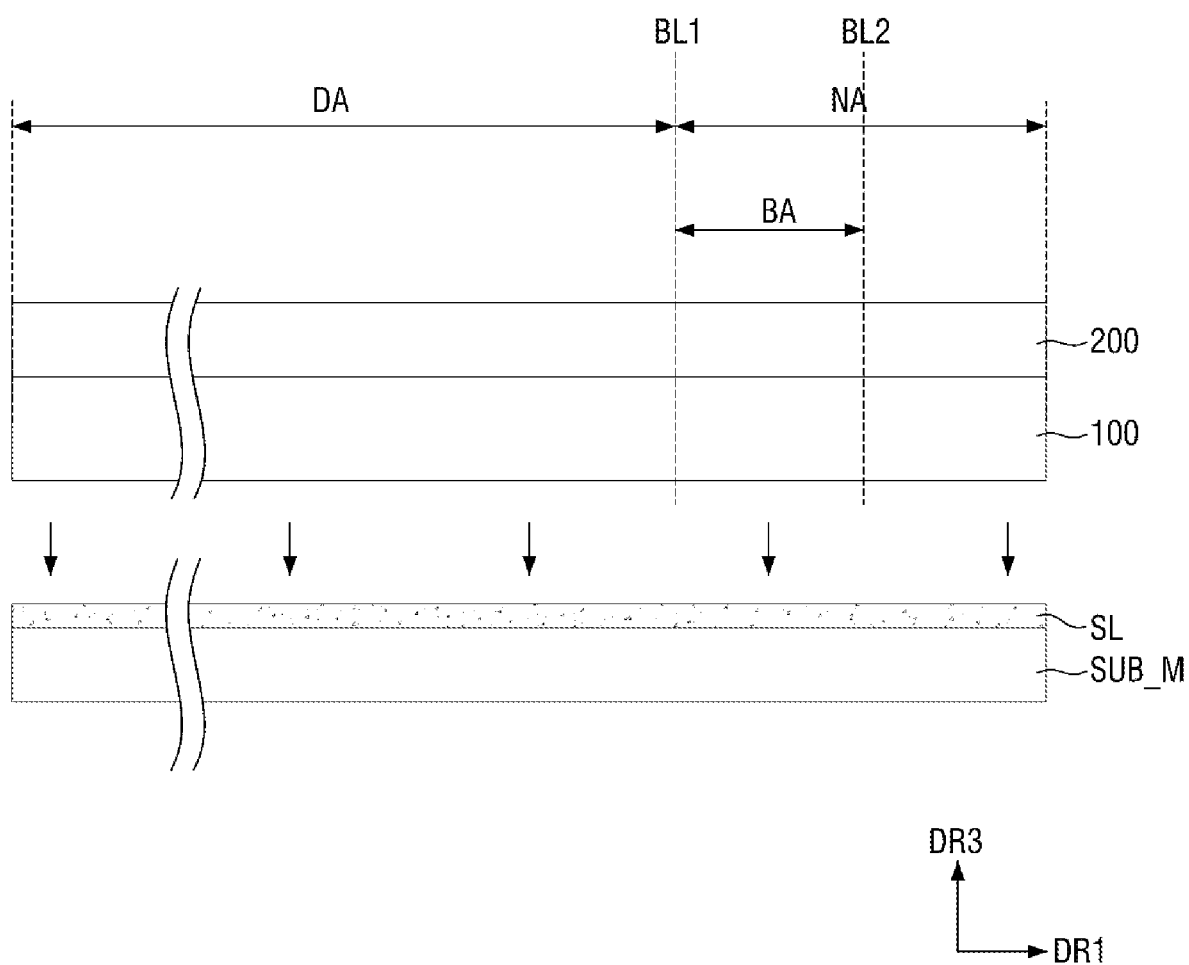

Referring to FIGS. 2, 15, and 20, laser is applied to the lower mother substrate SUB_M (S115).

Laser light LS may be applied to a first surface of the lower mother substrate SUB_M in the third direction DR3, i.e., the opposite surface to the surface of the lower mother substrate SUB_M where the sacrificial layer SL is disposed. The laser may be UV laser having a UV wavelength. In response to the laser being applied to the entire first surface of the lower mother substrate SUB_M, the adhesion between the sacrificial layer SL and the base substrate 101 may weaken.

Referring to FIGS. 2, 15, 21, and 22, the lower mother substrate SUB_M is removed (S115).

As described above, if laser is applied to the entire first surface of the lower mother substrate SUB_M, the adhesion between the sacrificial layer SL and the base substrate 101 may weaken, and the display panel 100 including the base substrate 101 may be separated from the sacrificial layer SL and the lower mother substrate SUB_M.

In step S115, the lower mother substrate SUB_M may be separated from the display panel 100 by, for example, attaching and fixing an attachment stage (not illustrated) to a first surface of the temporary protective film 200 in the third direction DR3 and moving the attachment stage upwardly in the third direction DR3, but exemplary embodiments are not limited thereto. That is, the lower mother substrate SUB_M may be separated from the display panel 100 using means other than the attachment stage.

Figure 22:
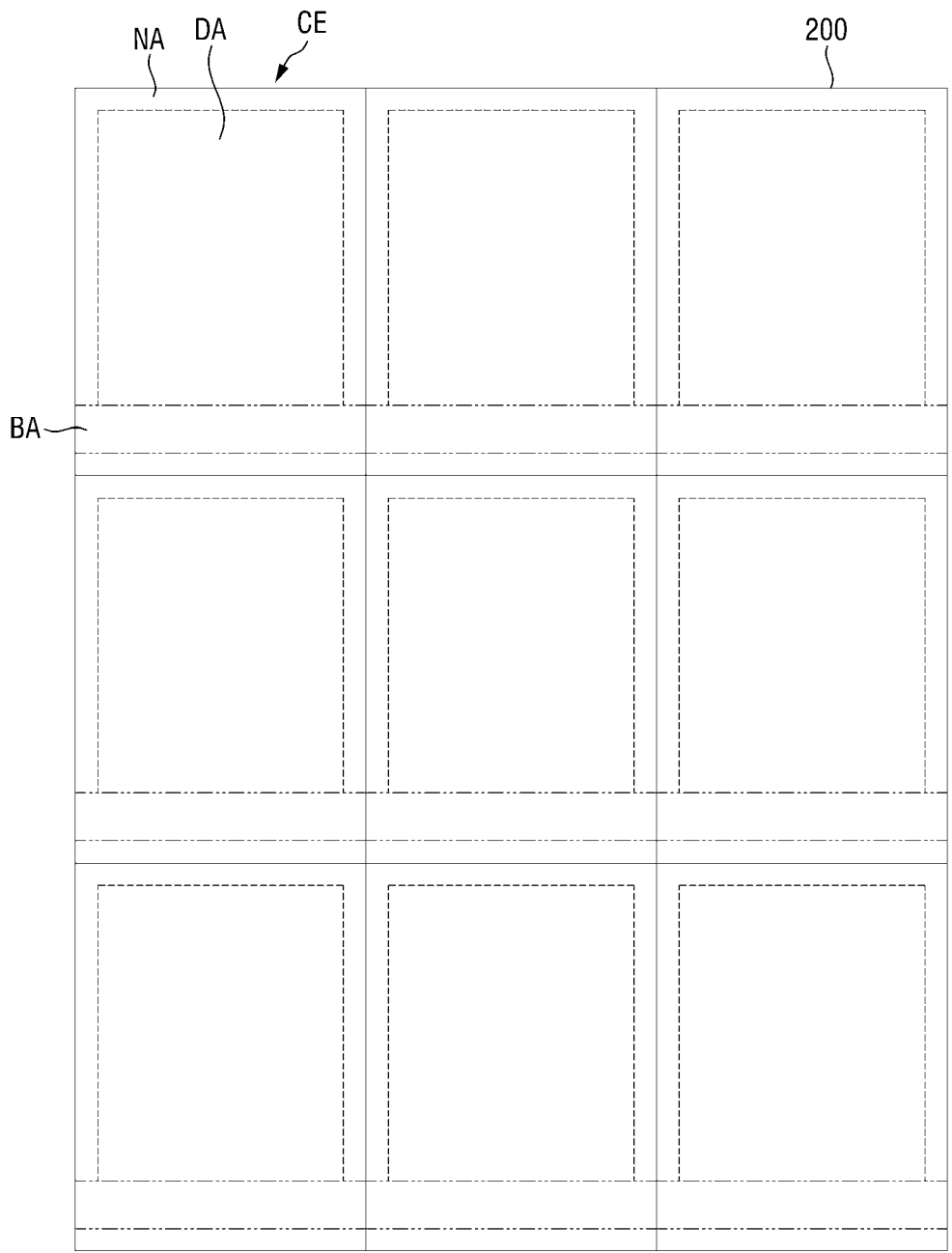
FIGS. 22, 23A, 23B, 23C, 24, 25A, 25B, 25C, 25D, and 26 are layout views or perspective views illustrating processes that follow the method of FIG. 16.
Figure 22:
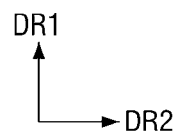

Referring to FIG. 22, the temporary protective film 200 may support an upper stack structure including the display panel 100 during the fabrication of each display device.

Referring to FIGS. 2, 6, 15, 23A, 23B, and 23C, adhesion prevention films 400 are coated on the bending areas BA of the cells CE (S125).

In step S125, the adhesion prevention films 400 may be coated on the base substrate 101 including the cells CE using a coating device 800. The coating device 800 may continuously coat the adhesion prevention films 400 in one direction across the entire surface of the base substrate 101. As described above, since the bending areas BA of each pair of adjacent cells CE in a second direction DR2 are disposed adjacent to each other in the second direction DR2, the coating device 800 may continue to coat the adhesion prevention films 400 along each of the bending areas BA of the cells CE without cessation.

The adhesion prevention films 400 may be coated on the base substrate 101, including the cells CE, along first and second boundaries BL1 and BL2 of each of the bending areas BA. The adhesion prevention films 400 are illustrated as extending outwardly beyond the first and boundaries BL1 and BL2 of each of the bending areas BA, but exemplary embodiments are not limited thereto. The adhesion prevention films 400 may be coated to be substantially aligned with the first and boundaries BL1 and BL2 of each of the bending areas BA.

Figure 23A:
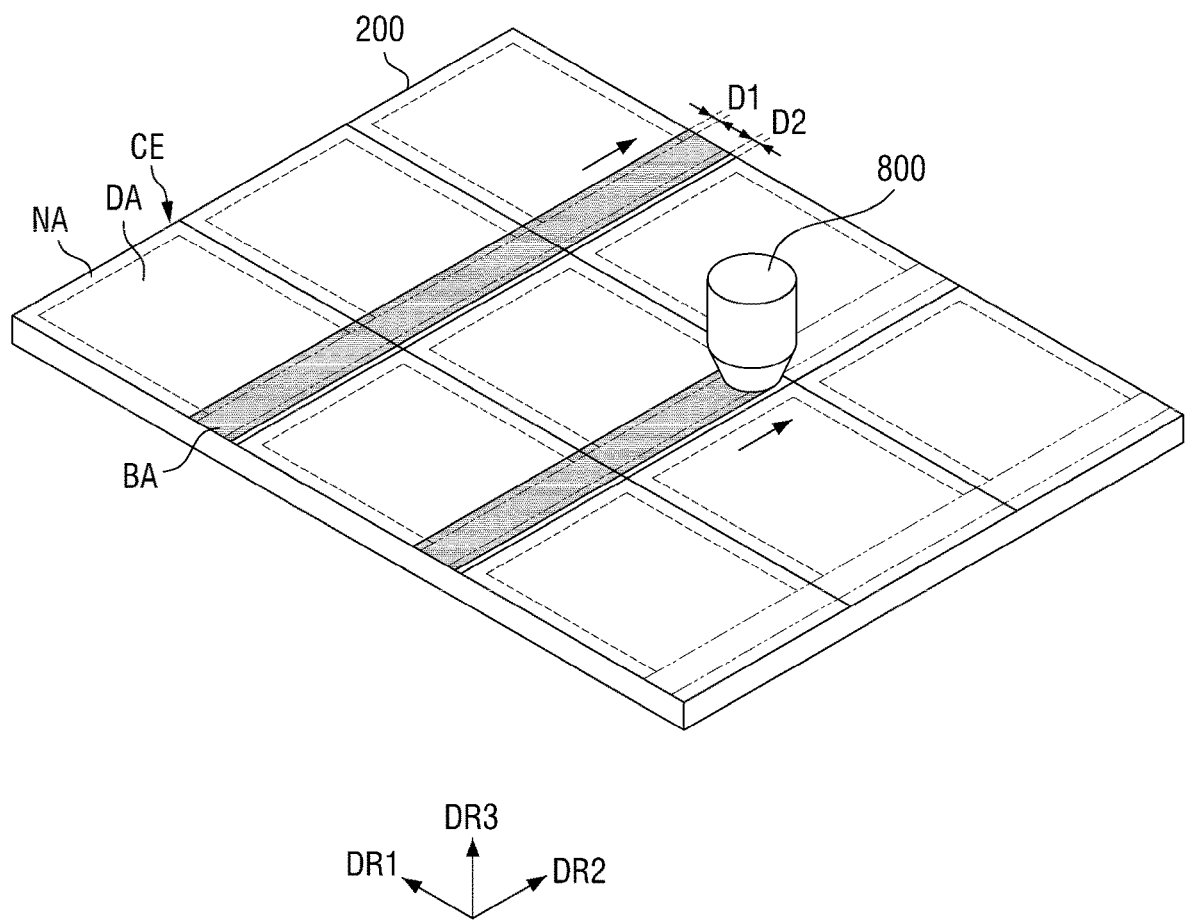

For example, as illustrated in FIG. 23A, the coating device 800 may coat the adhesion prevention films 400, along the second direction DR2, on the bending areas BA of each array of cells CE. Specifically, the coating device 800 may coat adhesion prevention films 400, along the second direction DR2, on the bending areas BA of an array of cells CE adjacent to a first end of the base substrate 101 in the first direction DR1, and a predetermined amount of time later, the coating device 800 may coat adhesion prevention films 400, along the second direction DR2, on the bending areas BA of an array of cells CE adjacent, in the first direction DR1, to the array of cells CE adjacent to the first end of the base substrate 101. In this case, the adhesion prevention films 400 may be coated in parallel directions.

Figure 23B:
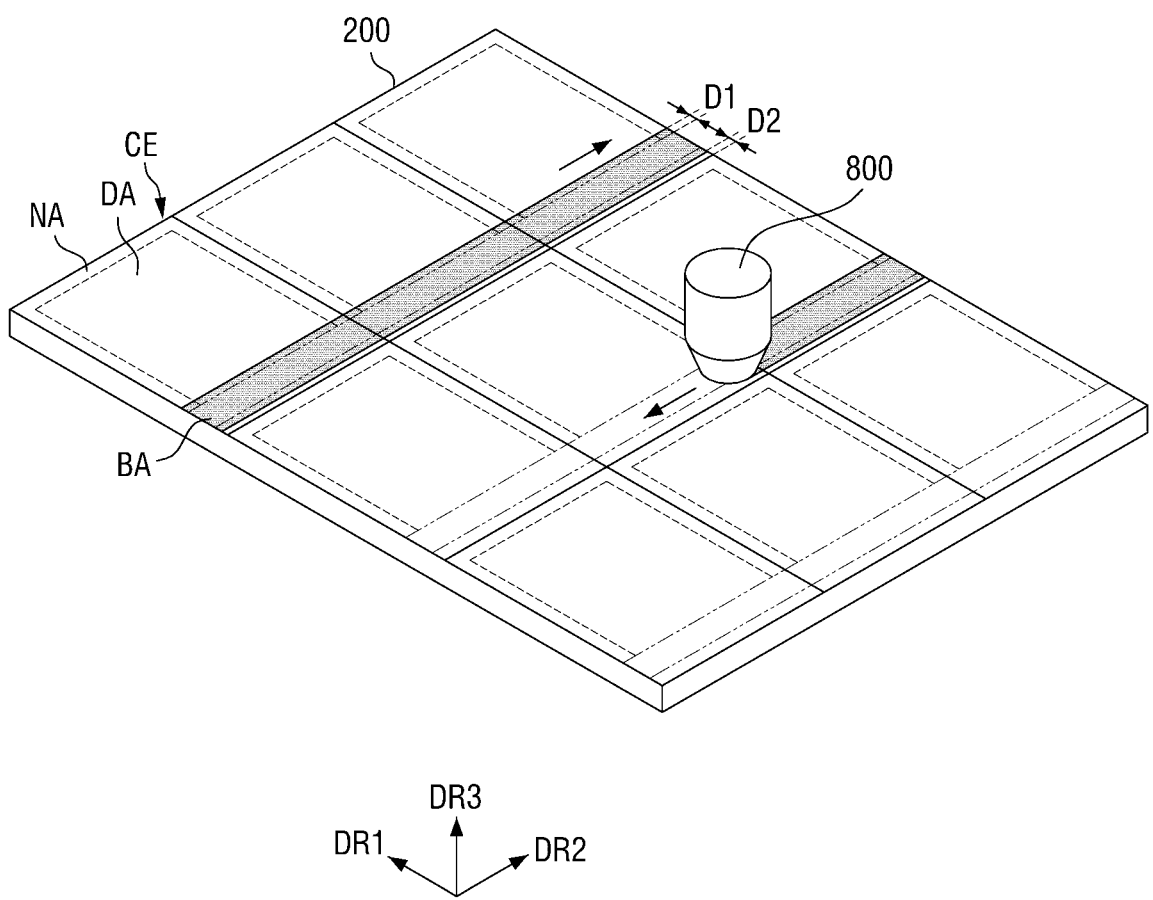

The example of FIG. 23B differs from the example of FIG. 23A in that the coating device 800 may coat the adhesion prevention films 400 on the bending areas BA of each array of cells CE while changing its direction from one array to another array of cells CE. Specifically, the coating device 800 may coat the adhesion prevention films 400 in a zigzag manner by coating adhesion prevention films 400 on the bending areas BA of one array of cells CE along the second direction DR2 and then coating adhesion prevention films 400 on the bending areas BA of another array of cells CE in the opposite direction to the second direction DR2.

Figure 23C:
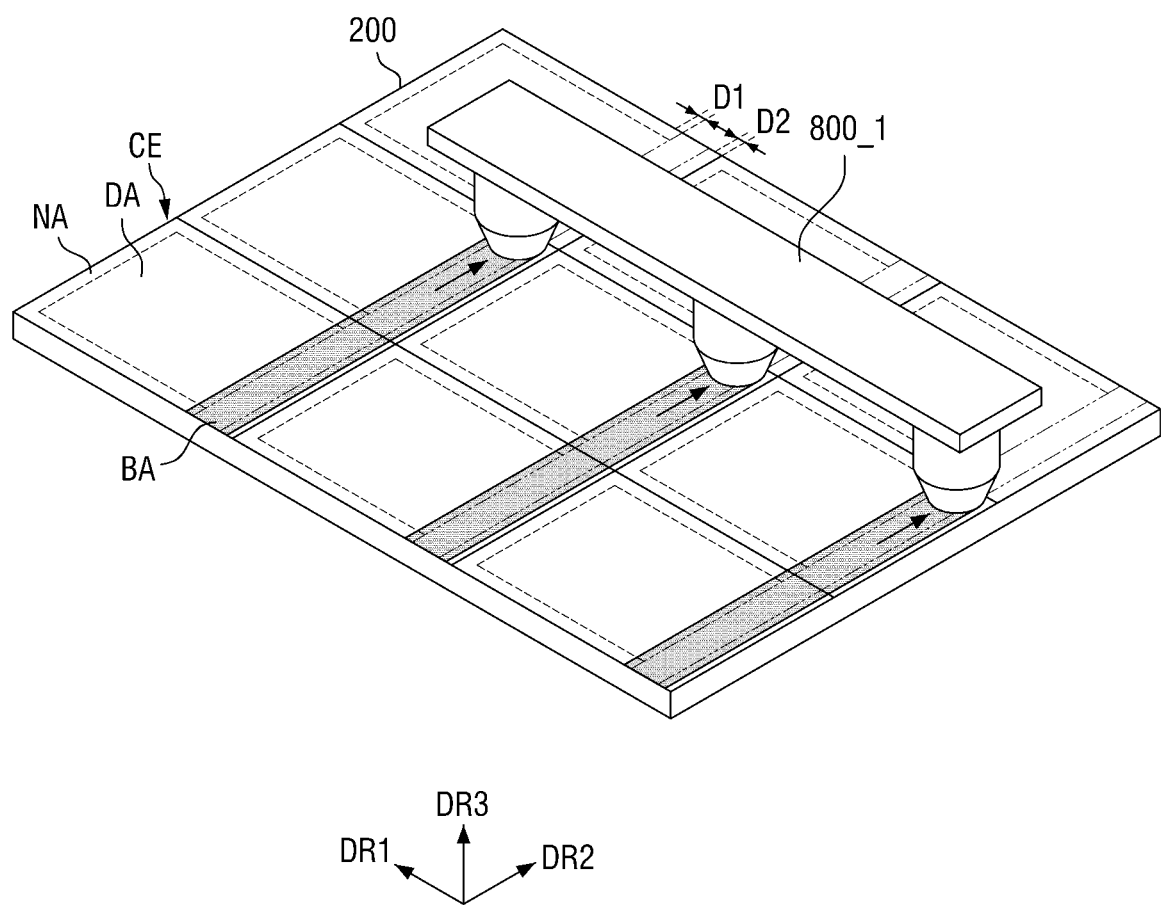
Figure 24:
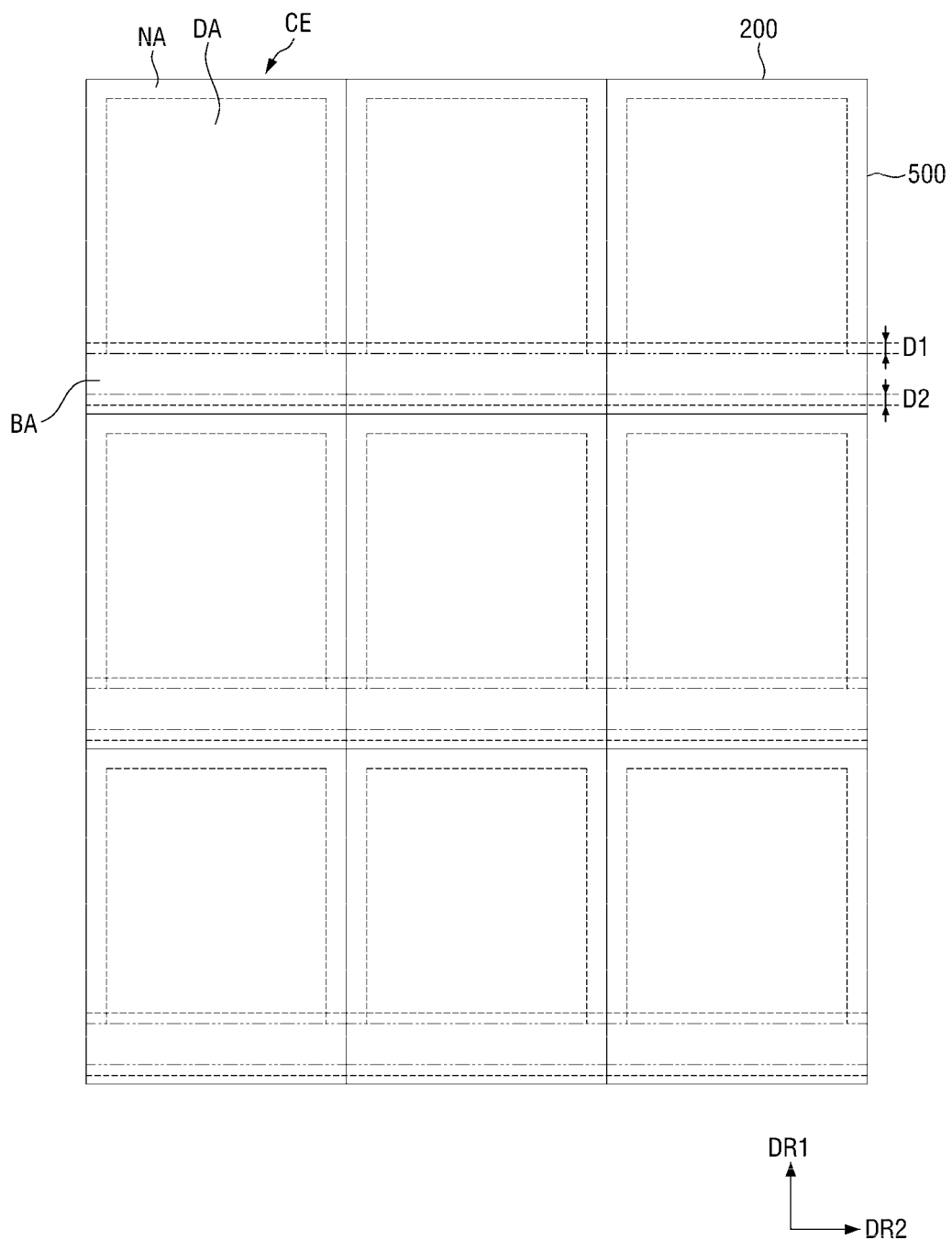

The example of FIG. 23C differs from the examples of FIGS. 23A and 23B in that a second coating device 800_1 may include a plurality of coating devices 800. Specifically, the second coating device 800_1 may include the plurality of coating devices 800 and may coat the adhesion prevention films 400 on the bending areas BA of different arrays of cells CE at the same time.

Referring to FIGS. 2, 7, 8, 15, and 24, a support film 500 is attached onto the display panel 100 and the adhesion prevention films 400 through an adhesive film 450 (S130).

The adhesive film 450 and the support film 500 may have the same area as the temporary protective film 200 in a plan view, but exemplary embodiments are not limited thereto. That is, the adhesive film 450 and the support film 500 may have a smaller area than the temporary protective film 200 in a plan view.

Referring to FIGS. 2, 9, 15, 25A, 25B, 25C, and 25D, the support film 500 and the adhesive film 450 are scribed along the boundaries (BL1 and BL2) of each of the bending areas BA using a cutting member 600 (S135), and parts of the support film 500 corresponding to the bending areas BA are removed (S140).

The cutting member 600 may scribe the support film 500 and the adhesive film 450, which are disposed on the entire surface of the temporary protective film 200. The cutting member 600 may scribe the support film 500 and the adhesive film 450 while moving in the second direction DR2.

Figure 25A:
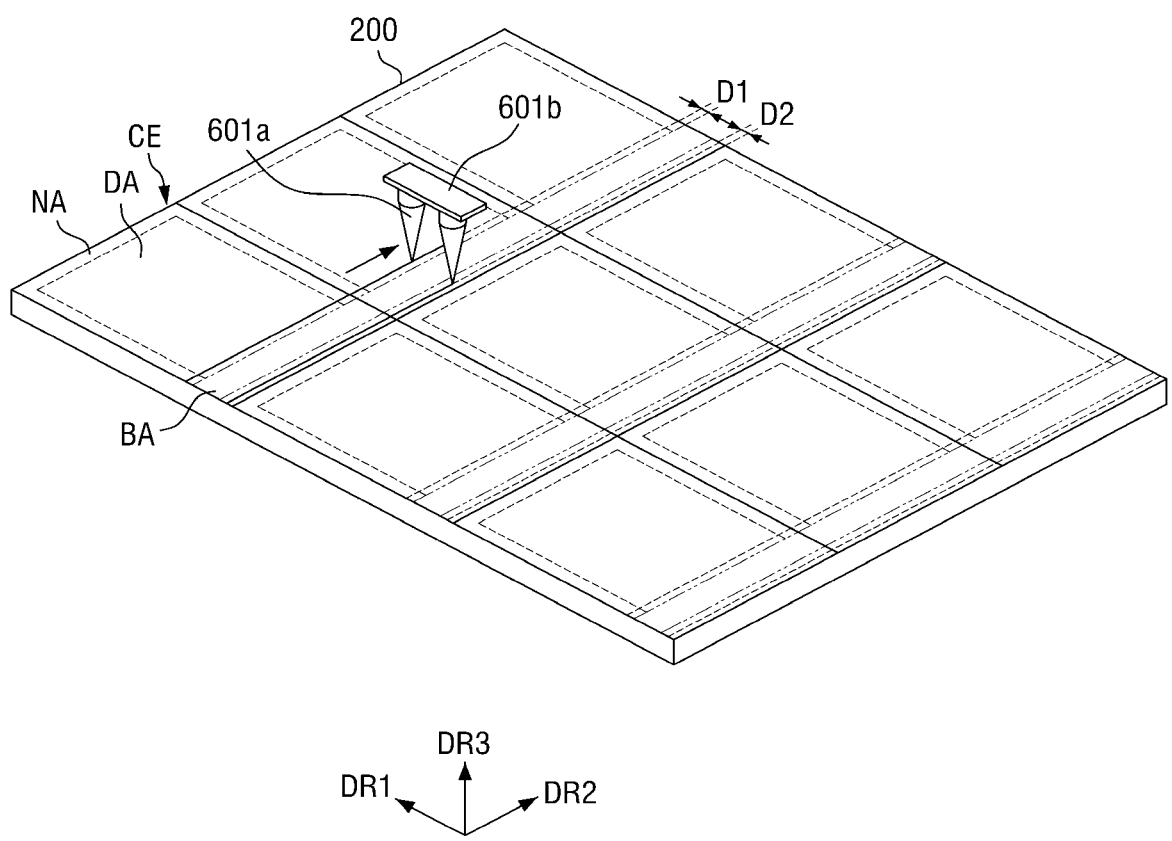

As illustrated in FIG. 25A, in step S135, the support film 500 and the adhesive film 450 may be scribed using a heat knife 601. As described above, since the bending areas BA of each pair of adjacent cells CE are disposed adjacent to each other, the heat knife 601 may continuously perform scribing along one direction without cessation. For example, the heat knife 601 may perform scribing along the second direction DR2.

Figure 25B:
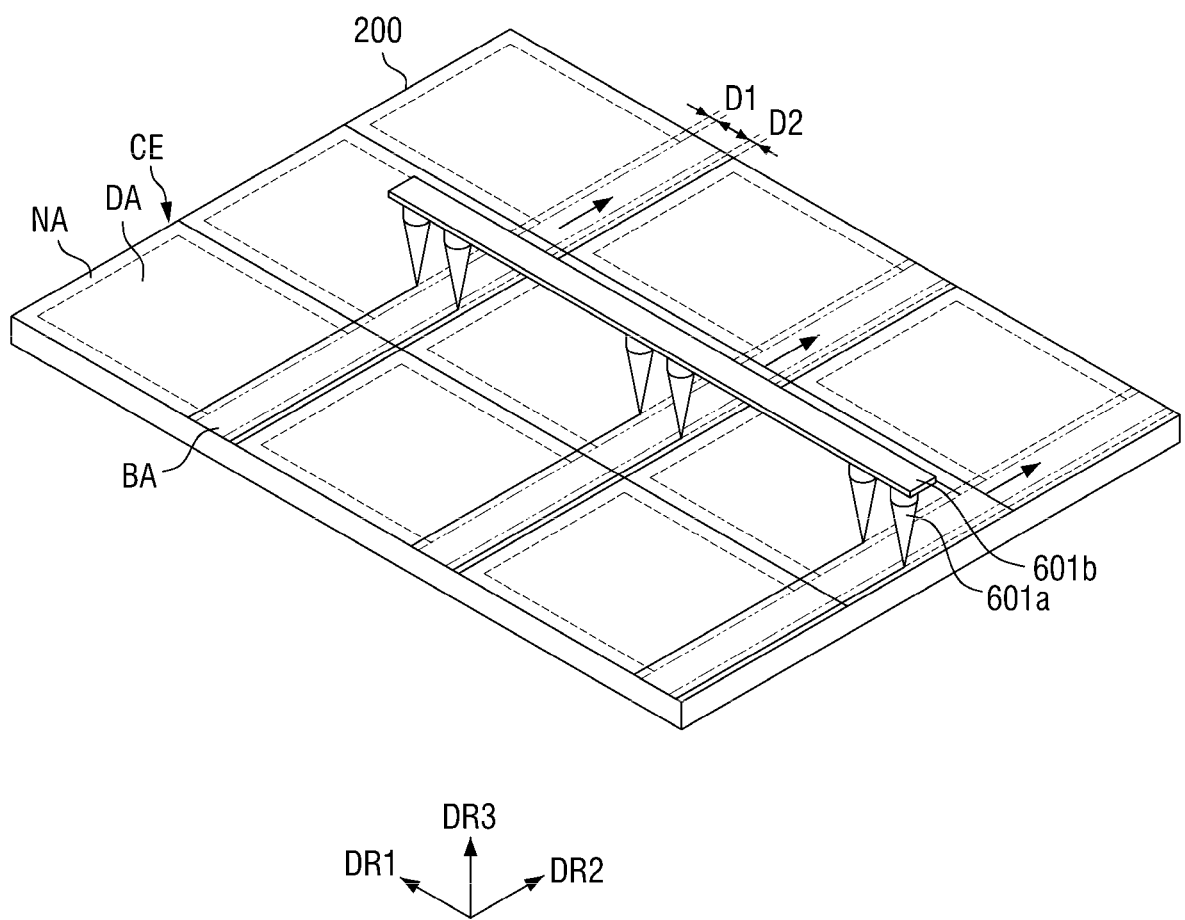

The example of FIG. 25B differs from the example of FIG. 25A in that multiple heat knifes 601 are used in step S135.

FIG. 25A illustrates an example in which scribing is performed using three heat knifes 601, but exemplary embodiments are not limited thereto.

Figure 25C:
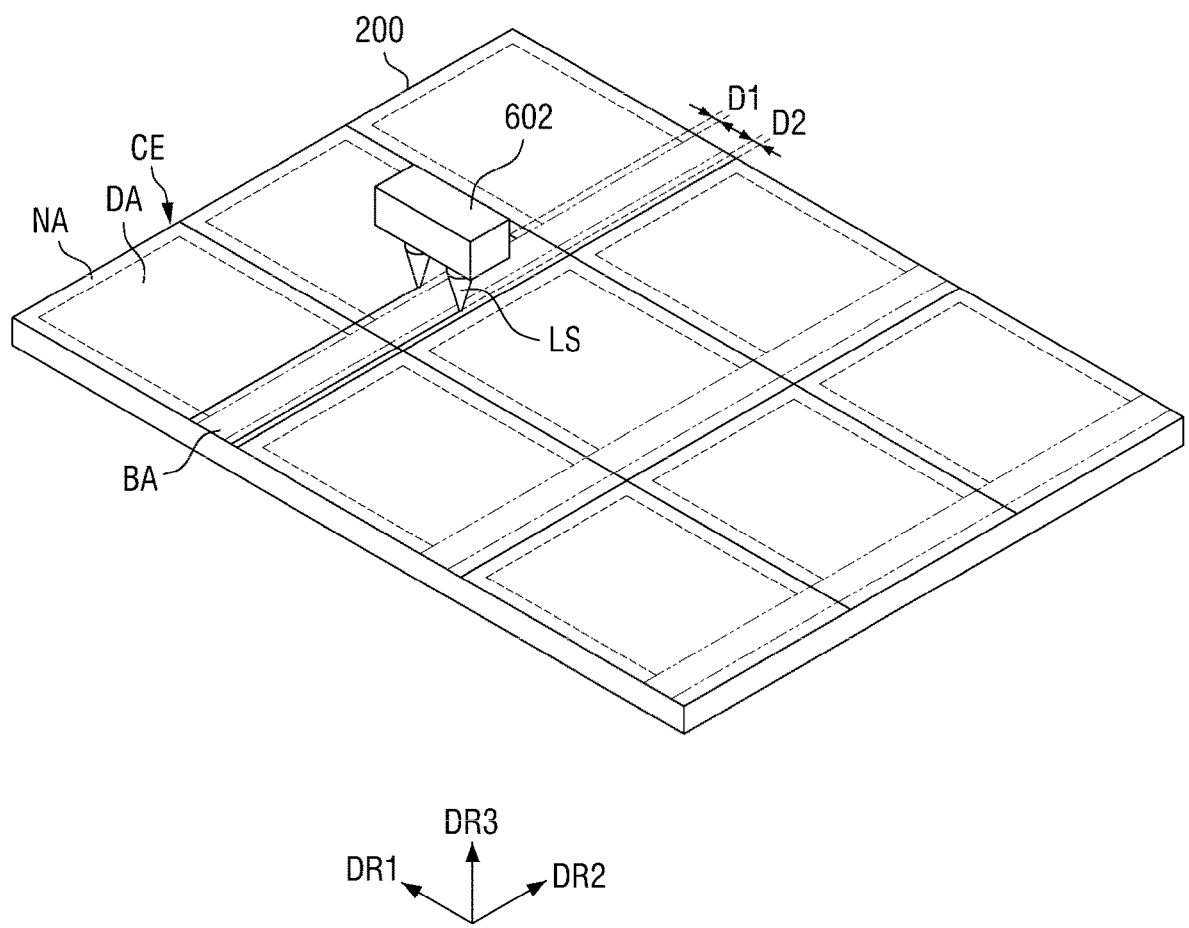

As illustrated in FIG. 25C, in step S135, the support film 500 and the adhesive film 450 may be scribed using a laser member 602. As described above, since the bending areas BA of each pair of adjacent cells CE are disposed adjacent to each other, the laser member 602 may continuously perform scribing along one direction without cessation. For example, the laser member 602 may perform scribing along the second direction DR2.

Figure 25D:
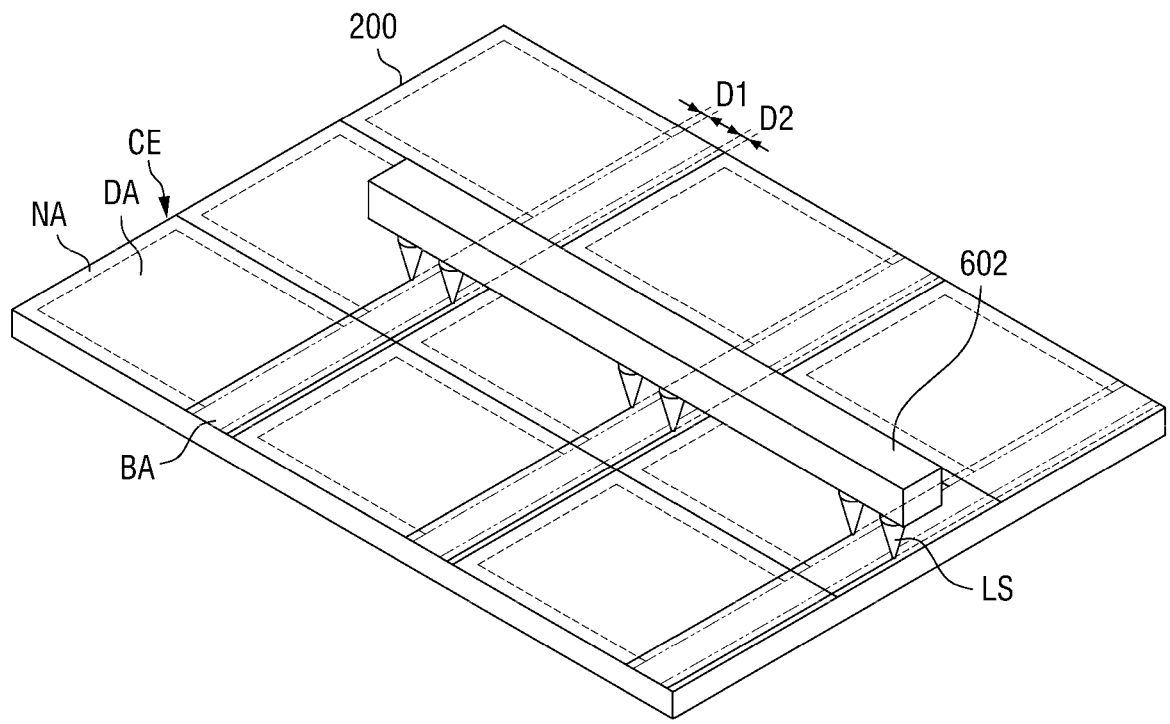
Figure 25D:
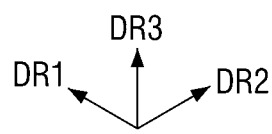

The example of FIG. 25D differs from the example of FIG. 25C in that multiple laser members 602 are used in step S135.

FIG. 25D illustrates an example in which scribing is performed using three laser members 602, but exemplary embodiments are not limited thereto.

As a result of step S140, parts of the support film 500 and the adhesive film 450 on the inside of each scribed part are removed.

In step S140, if the adhesion prevention films 400 extend outwardly beyond at least one of the boundaries (BL1 and BL2) of each of the bending areas BA, parts of the adhesion prevention films 400 may remain.

Referring to FIGS. 2, 15, 26, and 27, laser is applied to the boundaries between the cells CE (S145).

Laser may be applied to the boundaries between the cells CE while moving along the boundaries between the cells CE from above the temporary protective film 200. As illustrated in FIG. 26, laser may be applied to the boundaries between the cells CE while moving in the first and second directions DR1 and DR2. As illustrated in FIG. 27, as a result of step S145, each of the cells CE may be separated.

Referring to FIGS. 2, 15, and 28, the temporary protective film 200 is removed (S150).

Some of the advantages that may be achieved by exemplary implementations/embodiments of the invention and/or exemplary methods of the invention include providing a display device which can be easily bent and can prevent a display panel from cracking, as well as a method of manufacturing a display device which can allow a support film to be easily cut in a bending area and can prevent damage to a base substrate.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display device, comprising:
preparing a base substrate of the display device comprising a first area,
a second area,
and a bending area that is disposed between the first and second areas;
applying a coating film pattern to the base substrate to protrude from a first surface of the base substrate in the bending area,
the coating film pattern comprising a second surface in direct contact with the first surface and a third surface that is opposite the second surface;
adhesively attaching a support plate, which comprises an adhesive film and a support film, on the first surface of the base substrate to cover the coating film pattern; and
separating the support plate and the coating film pattern, which overlap with each other in a thickness direction, from the base substrate,
wherein attaching the support plate comprises disposing the support plate in such a manner that the adhesive film is moved into contact with the third surface of the coating film pattern and the first surface of the base substrate, respectively,
wherein the third surface in the bending area is protruded from the first surface of the base substrate in the first area in a thickness direction,
wherein separating the support plate and the coating film pattern comprises scribing the support plate and separating the support plate into a first support plate in the first area and a second support plate in the second area,
wherein each of the first and second support plates comprises a burr-shaped portion directly adjacent the bending area,
wherein a first bonding force between the adhesive film and the coating film pattern is greater than a second bonding force between the base substrate and the coating film pattern, and
wherein a third bonding force between the adhesive film and the first surface of the base substrate is greater than the second bonding force.

2. The method of claim 1, wherein scribing the support plate comprises scribing the support plate along a first boundary between the first area and the bending area and along a second boundary between the second area and the bending area.

3. The method of claim 2, wherein scribing the support plate further comprises scribing the support plate along the first and second boundaries at the same time.

4. The method of claim 2, wherein scribing the support plate comprises using a laser member or a heat knife.

5. The method of claim 1, wherein separating the support plate and the coating film pattern comprises separating both the scribed support plate in the bending area and the coating film pattern coupled to the adhesive film of the scribed support plate in the bending area.

6. The method of claim 1, wherein adhesively attaching the support plate comprises coupling the adhesive film and the coating film pattern together.

7. The method of claim 1, wherein:
the first bonding force is the same in both disposing the support plate and separating the support plate and the coating film pattern, and
the second bonding force is the same in both disposing the support plate and separating the support plate and the coating film pattern.

8. The method of claim 1, wherein:
the coating film pattern comprises at least one of olefin, silicone, long-chain alkyl, and fluorine molecules, and
the adhesive film comprises a pressure sensitive adhesive (PSA).

9. A method of manufacturing a display device, comprising:
preparing a base substrate comprising a first area, a second area, and a bending area that is disposed between the first and second areas, the base substrate having a first surface, and a second surface opposite to the first surface;
disposing a driving layer on the second surface;
disposing an organic light-emitting diode (OLED) layer on the driving layer;
applying a coating film pattern to the base substrate to protrude from the first surface of the base substrate in the bending area, the coating film pattern comprising a third surface in direct contact with the first surface and a fourth surface that is opposite the third surface;

adhesively attaching a support plate, which comprises an adhesive film and a support film, on the first surface of the base substrate to cover the coating film pattern; and separating the support plate and the coating film pattern, which overlap with each other in a thickness direction, from the base substrate, wherein attaching the support plate comprises disposing the support plate in such a manner that the adhesive film is in contact with the fourth surface of the coating film pattern and the first surface of the base substrate, respectively, wherein the fourth surface in the bending area is protruded from the first surface of the base substrate in the first area in a thickness direction, wherein separating the support plate and the coating film pattern comprises scribing the support plate and separating the support plate into a first support plate in the first area and a second support plate in the second area, wherein each of the first and second support plates comprises a burr-shaped portion directly adjacent the bending area, wherein a first bonding force between the adhesive film and the fourth surface of the coating film pattern is greater than a second bonding force between the first surface of the base substrate and the coating film pattern, and wherein a third bonding force between the adhesive film and the first surface of the base substrate is greater than the second bonding force.

* * * * *